(12) United States Patent
Lee

(10) Patent No.: US 7,946,727 B2
(45) Date of Patent: May 24, 2011

(54) MODULAR STRUCTURE OF LED LIGHT SOURCE

(75) Inventor: Hsin-Nung Lee, Taipei (TW)

(73) Assignee: Sinology Enterprise Ltd., Sijhih, Taipei County (TW)

( * ) Notice: Subject to any disclaimer, the term of this patent is extended or adjusted under 35 U.S.C. 154(b) by 382 days.

(21) Appl. No.: 12/351,865

(22) Filed: Jan. 12, 2009

(65) Prior Publication Data

US 2010/0123380 A1    May 20, 2010

(30) Foreign Application Priority Data

Nov. 19, 2008   (TW) .............................. 97144607 A

(51) Int. Cl.
*F21S 4/00* (2006.01)
*F21V 21/00* (2006.01)
(52) U.S. Cl. .............................. 362/249.06; 362/249.14
(58) Field of Classification Search ............. 362/249.02, 362/249.06, 249.14, 249.16, 646; 361/782–784
See application file for complete search history.

(56) References Cited

U.S. PATENT DOCUMENTS

| | | | | |
|---|---|---|---|---|
| 4,577,264 A * | 3/1986 | Plumly | ......................... | 362/150 |
| 5,213,409 A * | 5/1993 | Fisher | ..................... | 362/249.14 |
| 5,660,461 A * | 8/1997 | Ignatius et al. | ............... | 362/241 |
| 6,065,854 A * | 5/2000 | West et al. | ................. | 362/249.06 |
| 6,175,342 B1 * | 1/2001 | Nicholson et al. | ............. | 345/1.1 |
| 6,851,831 B2 * | 2/2005 | Karlicek, Jr. | ............. | 362/249.06 |
| 7,417,197 B2 * | 8/2008 | Kent et al. | ..................... | 174/261 |
| 7,648,254 B2 * | 1/2010 | Yoo et al. | ................. | 362/249.01 |
| 7,841,740 B2 * | 11/2010 | Zhou et al. | ............... | 362/249.02 |
| 7,845,828 B2 * | 12/2010 | Ku | ............................ | 362/249.02 |
| 7,897,980 B2 * | 3/2011 | Yuan et al. | ..................... | 257/88 |
| 2009/0244871 A1 * | 10/2009 | Lin | ................................ | 361/791 |

* cited by examiner

*Primary Examiner* — Alan Cariaso
(74) *Attorney, Agent, or Firm* — Stites & Harbison PLLC; Juan Carlos A. Marquez, Esq.

(57) ABSTRACT

A modular structure of a light-emitting diode (LED) light source is provided. The modular structure of the LED light source includes a circuit board and a plurality of LEDs. The LEDs are arranged on the circuit board as regular hexagons, with an equal distance between every two adjacent LEDs, so that the modular structure of the LED light source provides uniform illumination. Additionally, the modular structure of the LED light source takes on a modular design so as to form light sources of various sizes for different uses and thus have its application scope expanded.

19 Claims, 23 Drawing Sheets

MODULAR STRUCTURE OF LED LIGHT SOURCE

BACKGROUND OF THE INVENTION

1. Technical Field

The present invention relates to a modular structure of a light-emitting diode (LED) light source. More particularly, the present invention relates to a modular structure of an LED light source, wherein a plurality of the modular structures are capable of forming an integrated light source of various sizes.

2. Description of Related Art

For a long time in the past, light tubes have been used as the light source installed in most of advertising light boxes. However, in recent years, the prompt development of LED technology has enabled the mass production, and thereby lowering the selling prices, of LEDs, so that LEDs, with the descending selling prices in addition to their innate advantages such as having good shock resistance, being superior in power saving, being environmentally friendly, possessing compact volumes, enabling high-speed switching, and so forth, have shown great potential for replacing the traditional light tubes as an emerging alternative light source for advertising light boxes.

As to advertising light boxes themselves, they are produced in various shapes, sizes, and colors to meet the practical needs of all trades. As a result, custom-made LED light source modules are required to suit the dimensions of different advertising light boxes. However, in consideration of the manufacturing costs and selling prices of LED light source modules, manufacturers usually prefer to put only LED light source modules of popular sizes into mass production because those customized LED light source modules of special sizes, having limited market demands, tend to burden the manufacturers with inventory pressure.

On the other hand, an LED light source module of an advertising light box is typically composed of a plurality of LEDs each having a fixed light-emitting angle and direction, so that brightness and light uniformity of the LED light source module are determined by the arrangement of the LEDs.

Therefore, improper arrangement of the LEDs causes the resultant LED light source module to provide inferior illumination in a particular direction. Consequently, when such an LED light source module is used in an advertising light box, patterns and characters in certain areas of the advertising light box may look obscure due to insufficient illumination in that particular direction, thereby whittling down the efficacy of the advertising light box.

SUMMARY OF THE INVENTION

In view of the shortcomings of the conventional LED light source modules, the present invention proposes a modular structure of an LED light source, wherein the modular structure takes on a modular design and comes in a variety of dimensions, so that an integrated LED light source can be formed as desired in various sizes by assembling plural said modular structures having the appropriate dimensions. In consequence, potential inventory pressure brought by LED light sources of predefined sizes can be eliminated.

In the modular structure of the present invention, LEDs are arranged as an array of regular hexagons with an equal distance between every two adjacent said LEDs, so that the modular structure of the LED light source provides uniform illumination.

In the modular structure of the present invention, each edge of the modular structure has a different configuration composed of LEDs arranged as regular hexagons of different proportions so as to enable foolproof assembly between the modular structures of the present invention.

To achieve the aforementioned efficacy, the present invention provides a modular structure of a light-emitting diode (LED) light source, wherein the modular structure comprises a circuit board having a quadrilateral shape defined by a first edge, a second edge, a third edge, and a fourth edge, in which the first edge and the second edge are positioned opposite each other while the third edge and the fourth edge are positioned opposite each other; and a plurality of LEDs deposited on and electrically connected to the circuit board, and forming a plurality of adjoining regular hexagons, the first edge and the second edge of the circuit board each being composed of a plurality of ½-regular hexagons, the third edge being composed of at least one (n-m)/n-regular hexagon, the fourth edge being composed of at least one m/n-regular hexagon, wherein n and m are natural numbers, n>m, and n≠2.

To achieve the aforementioned efficacy, the present invention also provides a modular structure of an LED light source, wherein the modular structure comprises a circuit board having a quadrilateral shape defined by a fifth edge, a sixth edge, a seventh edge, and an eighth edge, in which the fifth edge and the sixth edge are positioned opposite each other while the seventh edge and the eighth edge are positioned opposite each other; and a plurality of LEDs deposited on and electrically connected to the circuit board, and forming a plurality of adjoining regular hexagons, the fifth edge and the sixth edge of the circuit board each being composed of at least one ½-regular hexagon, the seventh edge and the eighth edge each being composed of at least one (n-m)/n-regular hexagon, wherein n and m are natural numbers, n>m, and n≠2.

To achieve the aforementioned efficacy, the present invention further provides a modular structure of an LED light source, wherein the modular structure comprises a circuit board having a quadrilateral shape defined by a ninth edge, a tenth edge, an eleventh edge, and a twelfth edge, in which the ninth edge and the tenth edge are positioned opposite each other while the eleventh edge and the twelfth edge are positioned opposite each other; and a plurality of LEDs deposited on and electrically connected to the circuit board, and forming a plurality of adjoining regular hexagons, the ninth edge and the tenth edge of the circuit board each being composed of an (n-m)/2n-regular hexagon, the eleventh edge and the twelfth edge each being composed of at least one m/n-regular hexagon, wherein n and m are natural numbers, n>m, and n≠2.

By implementing the present invention, at least the following progressive effects can be achieved:

1. The LEDs are arranged as regular hexagons so that the modular structure of the LED light source provides uniform illumination.

2. The modular structure of the LED light source takes on a modular design that allows a light source to be formed as desired in various sizes for different uses, thereby expanding the application scope of the modular structure.

BRIEF DESCRIPTION OF THE DRAWINGS

A detailed description of further features and advantages of the present invention is given below so that a person skilled in the art is enabled to understand and implement the technical contents of the present invention and readily comprehend the objectives and advantages thereof by reviewing the teachings disclosed herein, the appended claims and the accompanying drawings, wherein:

DETAILED DESCRIPTION OF THE PREFERRED EMBODIMENTS

First Embodiment

Figure 1:
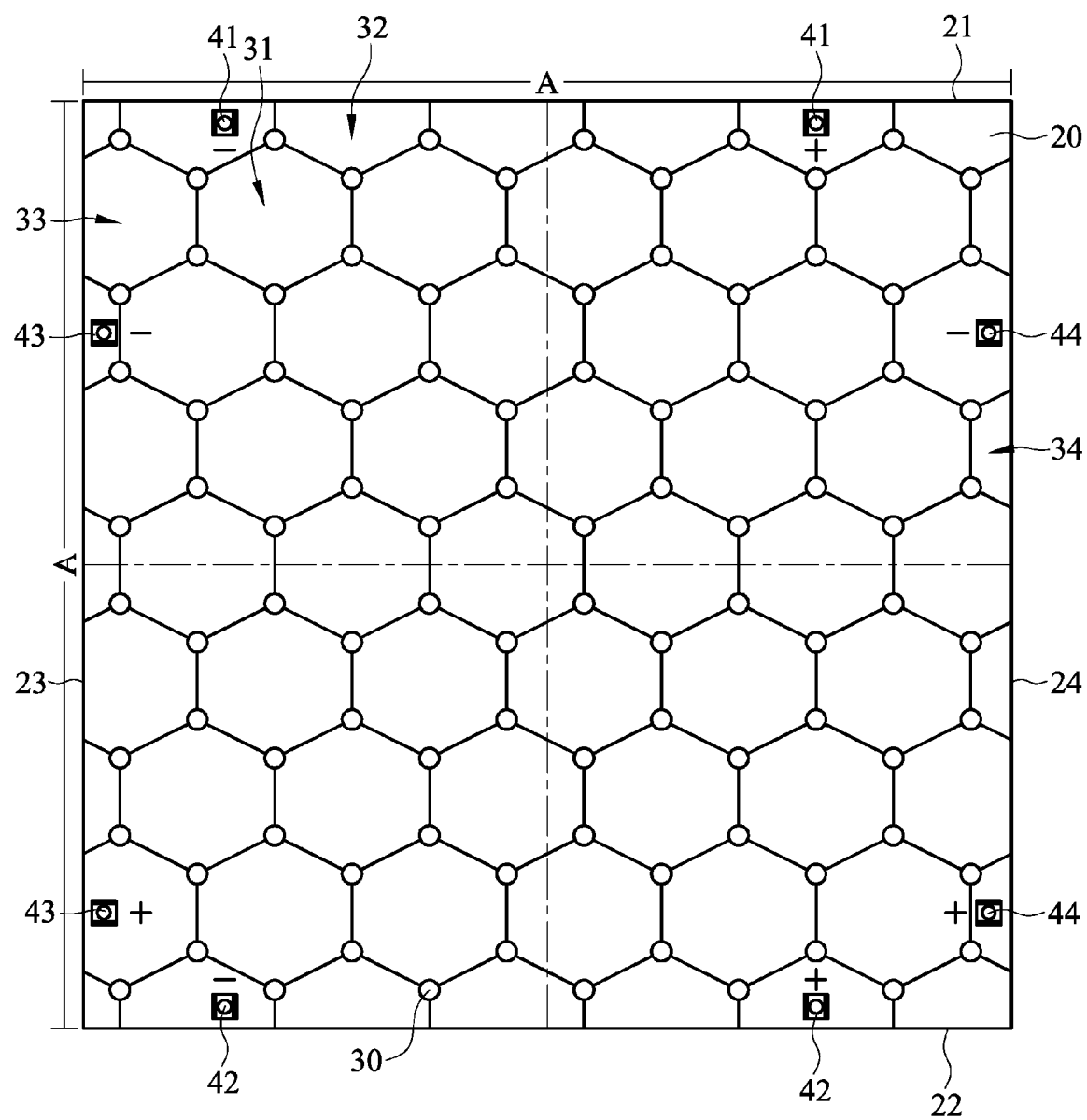
FIG. 1 shows a modular structure of an LED light source according to a first aspect of a first embodiment of the present invention.

FIGS. 1 through 4 show some aspects of a first embodiment of the present invention, that is, a modular structure of an LED light source. As shown in the drawings, each modular structure 101, 102, 103, or 104 of an LED light source comprises a circuit board 20 and a plurality of LEDs 30.

The circuit board 20 has a quadrilateral shape defined by a first edge 21, a second edge 22, a third edge 23, and a fourth edge 24. The first edge 21 and the second edge 22 of the circuit board 20 are positioned opposite each other while the third edge 23 and the fourth edge 24 of the circuit board 20 are positioned opposite each other. As shown in FIG. 1, the first edge 21 and the second edge 22 are the upper and lower edges of the circuit board 20, respectively, while the third edge 23 and the fourth edge 24 are the left and right edges of the circuit board 20, respectively.

Figure 2:
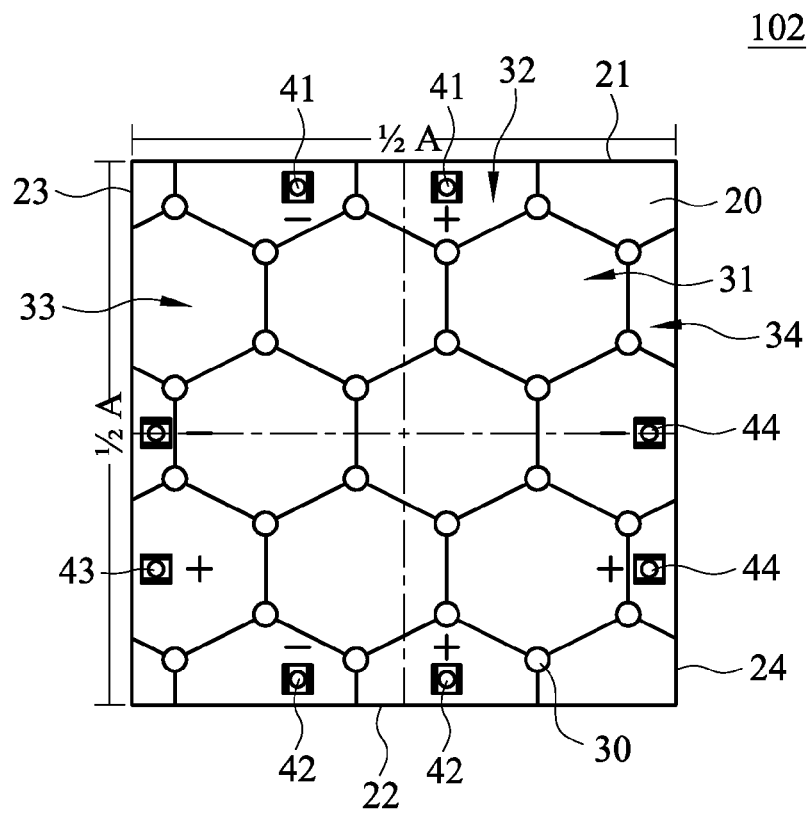
FIG. 2 shows a modular structure of an LED light source according to a second aspect of the first embodiment of the present invention.
Figure 3:
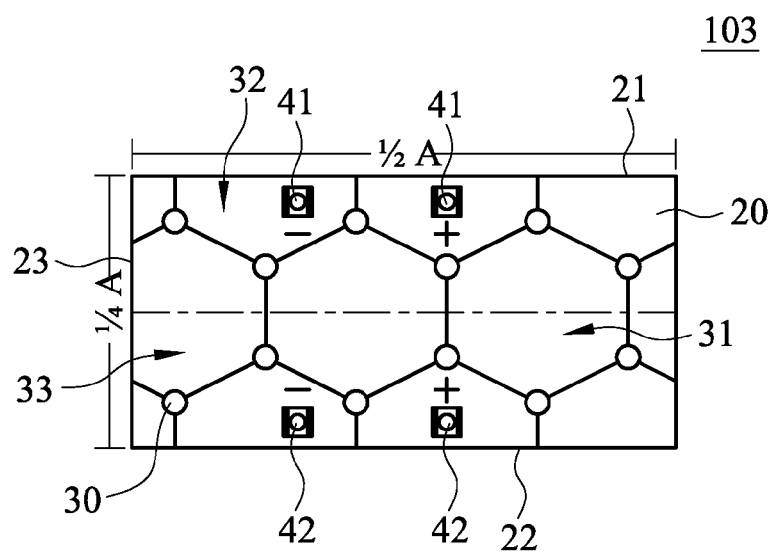
FIG. 3 shows a modular structure of an LED light source according to a third aspect of the first embodiment of the present invention.
Figure 4:
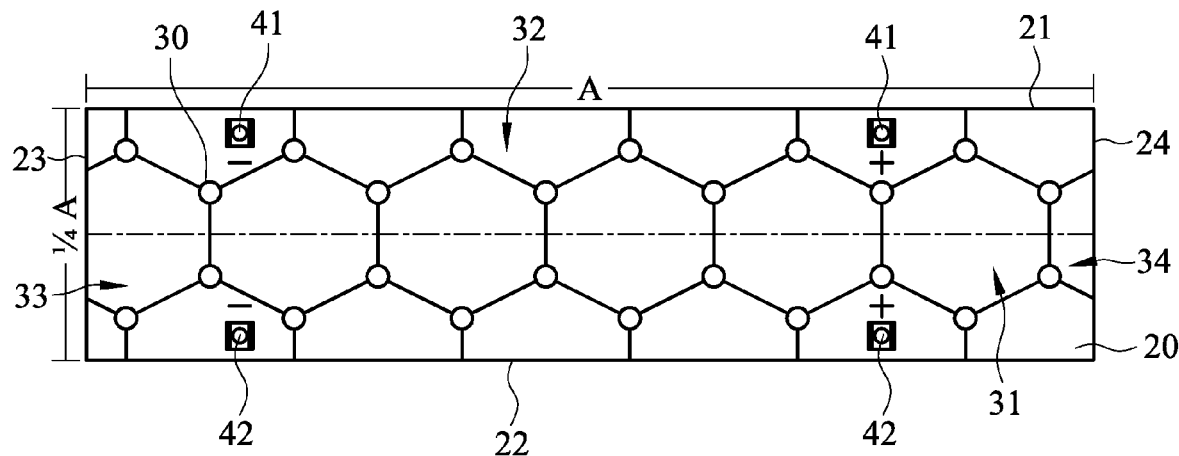
FIG. 4 shows a modular structure of an LED light source according to a fourth aspect of the first embodiment of the present invention.

The circuit board 20 is a square circuit board, as shown in FIG. 1 or FIG. 2, or a rectangular circuit board, as shown in FIG. 3 or FIG. 4. According to FIGS. 1 to 4, the circuit board 20 further comprises a set of first power connection ports 41 and a set of second power connection ports 42, wherein the first power connection ports 41 and the second power connection ports 42 are settled near the first edge 21 and the second edge 22, respectively, and are mirror images of each other across a line extending between midpoints of the third edge 23 and the fourth edge 24.

As shown in FIGS. 1 and 2, the circuit board 20 further has a set of third power connection ports 43 and a set of fourth power connection ports 44, wherein the third power connection ports 43 and the fourth power connection ports 44 are settled near the third edge 23 and the fourth edge 24, respectively, and are mirror images of each other across a line extending between midpoints of the first edge 21 and the second edge 22.

By the power connection ports 41, 42, 43, and 44, electrical connection of two said circuit boards 20 is made possible. Moreover, each of the power connection ports 41, 42, 43, and 44 is composed of an anode and a cathode. Consequently, plural said modular structures 101, 102, 103, and 104 can be assembled in various sizes as needed.

According to FIGS. 1 through 4, the LEDs 30 are deposited on and electrically connected to the circuit board 20, forming a plurality of adjoining regular hexagons 31 on the circuit board 20. As shown in FIGS. 3 and 4, the first edge 21 and the second edge 22 of the circuit board 20 are each composed of a plurality of ½-regular hexagons 32, the third edge 23 of the circuit board 20 is composed of at least one (n-m)/n-regular hexagon 33, and the fourth edge 24 of the circuit board 20 is composed of at least one m/n-regular hexagon 34, wherein n and m are natural numbers, n>m, and n≠2.

According to FIGS. 1 and 2, the third edge 23 and the fourth edge 24 are each composed of at least one (n-m)/n-regular hexagon 33 arranged alternately with at least one m/n-regular hexagon 34.

The edges 21, 22, 23, and 24 of the modular structures 101, 102, 103, and 104 have apparently different configurations and are thus easily recognizable to reduce errors in assembly of the modular structures 101, 102, 103, and 104.

For example, as shown in FIG. 1, the circuit board 20 of the modular structure 101 is a square circuit board that comprises a plurality of adjoining regular hexagons 31. When m=5 and n=24, the first edge 21 and the second edge 22 each have five ½-regular hexagons 32; the third edge 23 has four 19/24-regular hexagons 33 and three 5/24-regular hexagons 34; and the fourth edge 24 has four 5/24-regular hexagons 34 and three 19/24-regular hexagons 33.

Second Embodiment

Figure 5:
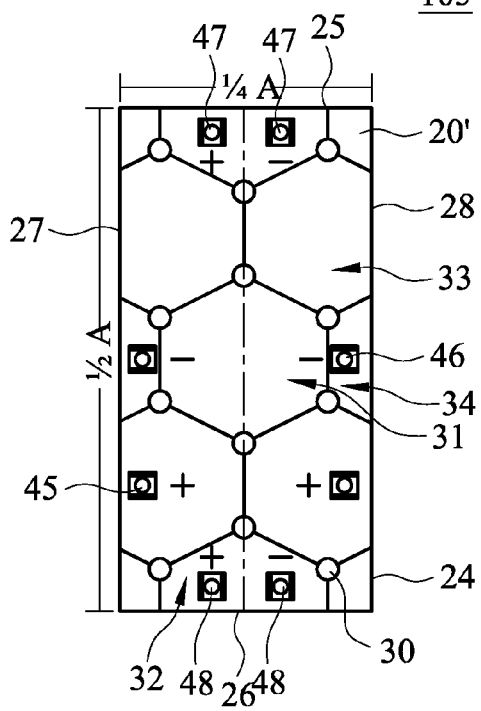
FIG. 5 shows a modular structure of an LED light source according to a first aspect of a second embodiment of the present invention.
Figure 6:
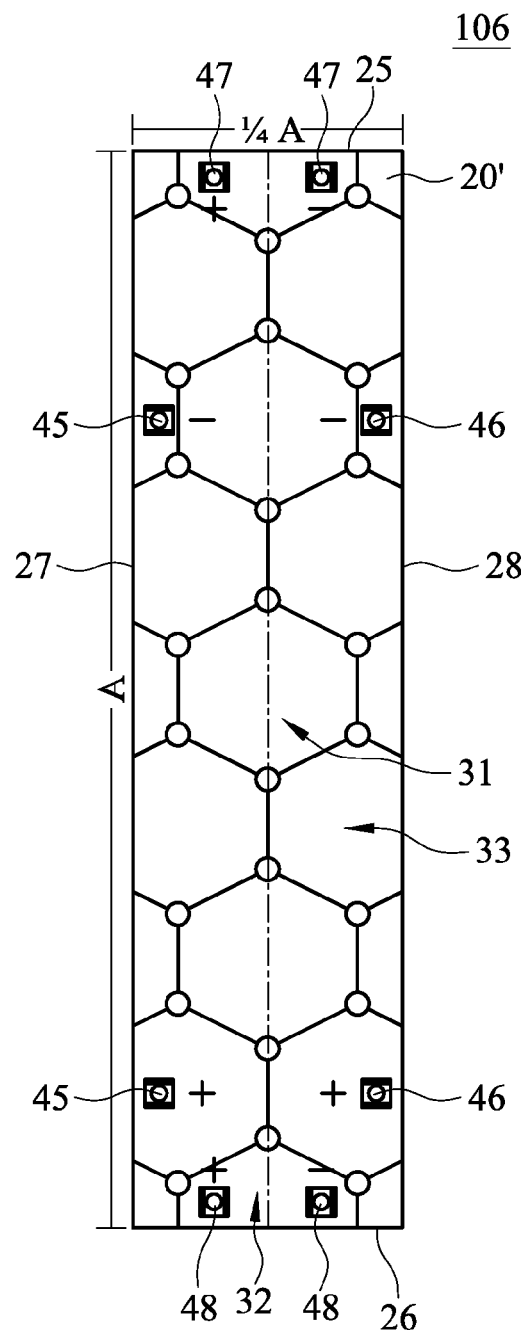
FIG. 6 shows a modular structure of an LED light source according to a second aspect of the second embodiment of the present invention.
Figure 7:
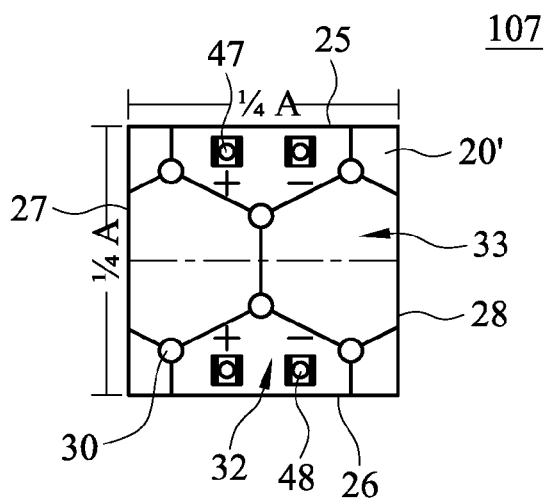
FIG. 7 shows a modular structure of an LED light source according to a third aspect of the second embodiment of the present invention.

FIGS. 5 through 7 show some aspects of a second embodiment of the present invention. Therein, each modular structure 105, 106, or 107 of an LED light source comprises a circuit board 20' and a plurality of LEDs 30.

The circuit board 20' has a quadrilateral shape defined by a fifth edge 25, a sixth edge 26, a seventh edge 27, and an eighth edge 28, wherein the fifth edge 25 and the sixth edge 26 are positioned opposite each other while the seventh edge 27 and the eighth edge 28 are positioned opposite each other. Referring to FIG. 5, the fifth edge 25 and the sixth edge 26 are the upper and lower edges of the circuit board 20', respectively, while the seventh edge 27 and the eighth edge 28 are the left and right edges of the circuit board 20', respectively.

The circuit board 20' is a rectangular circuit board, as shown in FIG. 5 or FIG. 6, or a square circuit board, as shown in FIG. 7. According to FIGS. 5 and 6, the circuit board 20' further comprises a set of fifth power connection ports 45 and a set of sixth power connection ports 46, wherein the fifth power connection ports 45 and the sixth power connection ports 46 are settled near the seventh edge 27 and the eighth edge 28 of the circuit board 20', respectively, and are mirror images of each other across a line extending between midpoints of the fifth edge 25 and the sixth edge 26 of the circuit board 20'.

As shown in FIGS. 5 through 7, the circuit board 20' further has a set of seventh power connection ports 47 and a set of eighth power connection ports 48, wherein the seventh power connection ports 47 and the eighth power connection ports 48 are settled near the fifth edge 25 and the sixth edge 26 of the circuit board 20', respectively, and are mirror images of each other across a line extending between midpoints of the seventh edge 27 and the eighth edge 28 of the circuit board 20'.

According to FIGS. 5 to 7, the LEDs 30 are deposited on and electrically connected to the circuit board 20', forming a plurality of adjoining regular hexagons 31 on the circuit board 20'. As shown in FIGS. 5 and 7, the fifth edge 25 and the sixth edge 26 are each composed of a ½-regular hexagon 32, and the seventh edge 27 and the eighth edge 28 are each composed of at least one (n-m)/n-regular hexagon 33, wherein n and m are natural numbers, n>m, and n≠2. According to FIG. 6, the seventh edge 27 and the eighth edge 28 are each composed of at least one (n-m)/n-regular hexagon 33 arranged alternately with at least one m/n-regular hexagon 34.

For example, as shown in FIG. 5, the circuit board 20' of the modular structure 105 is a rectangular circuit board that comprises a plurality of adjoining regular hexagons 31. With m=5 and n=24, the fifth edge 25 and the sixth edge 26 each have one ½-regular hexagon 32 while the seventh edge 27 and the eighth edge 28 each have two 19/24-regular hexagons 33 and one 5/24-regular hexagon 34.

Third Embodiment

Figure 8:
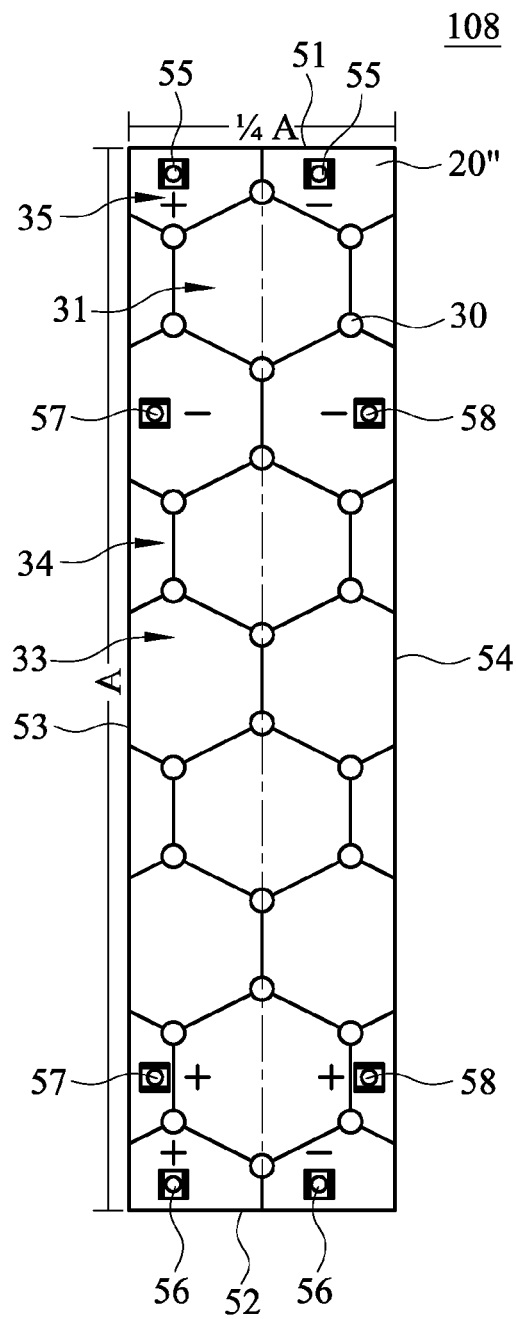
FIG. 8 shows a modular structure of an LED light source according to a first aspect of a third embodiment of the present invention.
Figure 9:
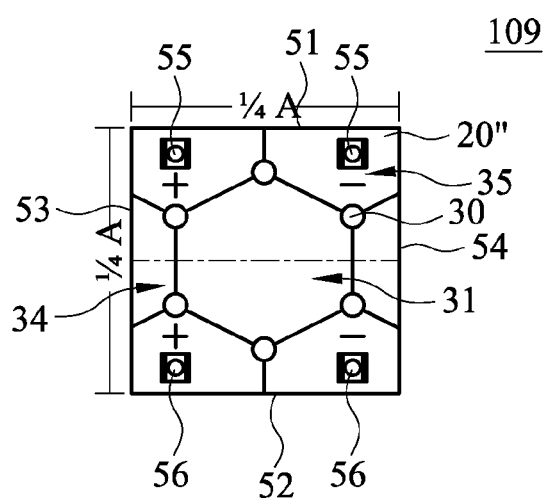
FIG. 9 shows a modular structure of an LED light source according to a second aspect of the third embodiment of the present invention.

FIGS. 8 and 9 show some aspects of a third embodiment of the present invention. Therein, each modular structure 108 or 109 of an LED light source comprises a circuit board 20" and a plurality of LEDs 30.

The circuit board 20" has a quadrilateral shape defined by a ninth edge 51, a tenth edge 52, an eleventh edge 53, and a twelfth edge 54, wherein the ninth edge 51 and the tenth edge 52 are positioned opposite each other while the eleventh edge 53 and the twelfth edge 54 are positioned opposite each other. Referring to FIG. 8, the ninth edge 51 and the tenth edge 52 are the upper and lower edges of the circuit board 20", respectively, while the eleventh edge 53 and the twelfth edge 54 are the left and right edges of the circuit board 20", respectively.

The circuit board 20" is a rectangular circuit board, as shown in FIG. 8, or a square circuit board, as shown in FIG. 9. According to FIGS. 8 and 9, the circuit board 20" further comprises a set of ninth power connection ports 55 and a set of tenth power connection ports 56, wherein the ninth power connection ports 55 and the tenth power connection ports 56 are settled near the ninth edge 51 and the tenth edge 52 of the circuit board 20", respectively, and are mirror images of each other across a line extending between midpoints of the eleventh edge 53 and the twelfth edge 54 of the circuit board 20".

As shown in FIG. 8, the circuit board 20" further has a set of eleventh power connection ports 57 and a set of twelfth power connection ports 58, wherein the eleventh power connection ports 57 and the twelfth power connection ports 58 are settled near the eleventh edge 53 and the twelfth edge 54 of the circuit board 20", respectively, and are mirror images of each other across a line extending between midpoints of the ninth edge 51 and the tenth edge 52 of the circuit board 20".

According to FIGS. 8 and 9, the LEDs 30 are deposited on and electrically connected to the circuit board 20", forming a plurality of adjoining regular hexagons 31 on the circuit board 20". As shown in FIG. 9, the ninth edge 51 and the tenth edge 52 are each composed of an (n-m)/2n-regular hexagon 35, and the eleventh edge 53 and the twelfth edge 54 are each composed of at least one m/n-regular hexagon 34, wherein n and m are natural numbers, n>m, and n≠2. According to FIG. 8, the eleventh edge 53 and the twelfth edge 54 are each composed of at least one (n-m)/n-regular hexagon 33 arranged alternately with at least one m/n-regular hexagon 34.

For example, as shown in FIG. 8, the circuit board 20" of the modular structure 108 is a rectangular circuit board that comprises a plurality of adjoining regular hexagons 31. With m=5 and n=24, the ninth edge 51 and the tenth edge 52 each have two 19/48-regular hexagons 35 while the eleventh edge 53 and the twelfth edge 54 each have three 19/24-regular hexagons 33 arranged alternately with four 5/24-regular hexagons 34.

Application of the modular structures 101, 102, 103, 104, 105, 106, 107, 108, and 109 of an LED light source as described above in the first, second, and third embodiments will be illustrated in the following paragraphs.

Figure 10A:
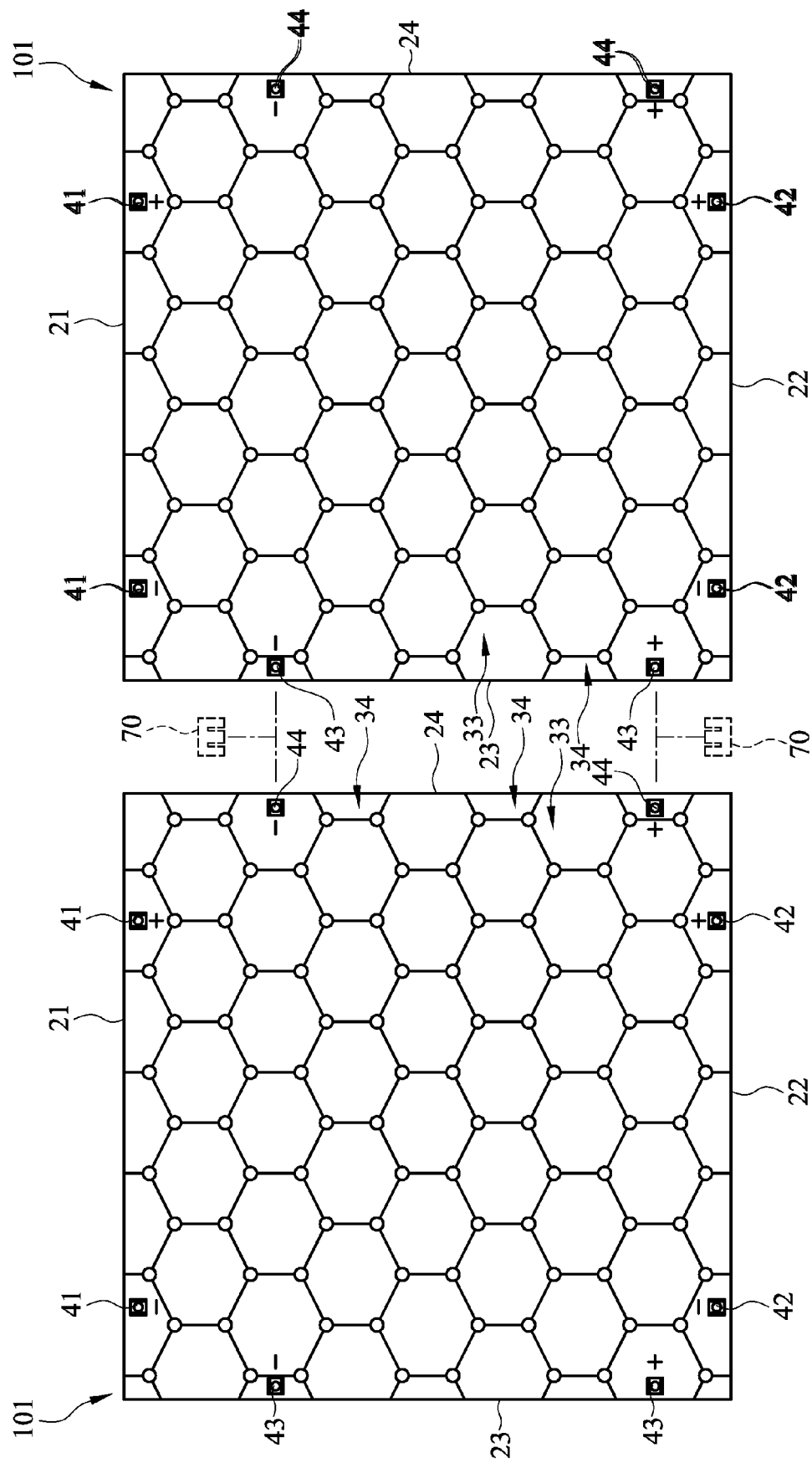
FIG. 10A illustrates assembly of the modular structures of the present invention.

Referring to FIG. 10A, upon assembling two said modular structures 101, since the LEDs 30 are arranged as a plurality of adjoining regular hexagons 31 on the circuit board 20 of each said modular structure 101, and each edge 21, 22, 23, or 24 of the circuit board 20 of each said modular structure 101 is composed of regular hexagons 31 of different proportions, only when the matching edges are aligned will regular hexagons 31 be formed by the aligned edges. For instance, only when the third edge 23 is set alongside the fourth edge 24 will regular hexagons 31 be formed by the adjoining third and fourth edges 23 and 24. Thus, a foolproof design is provided.

Figure 10B:
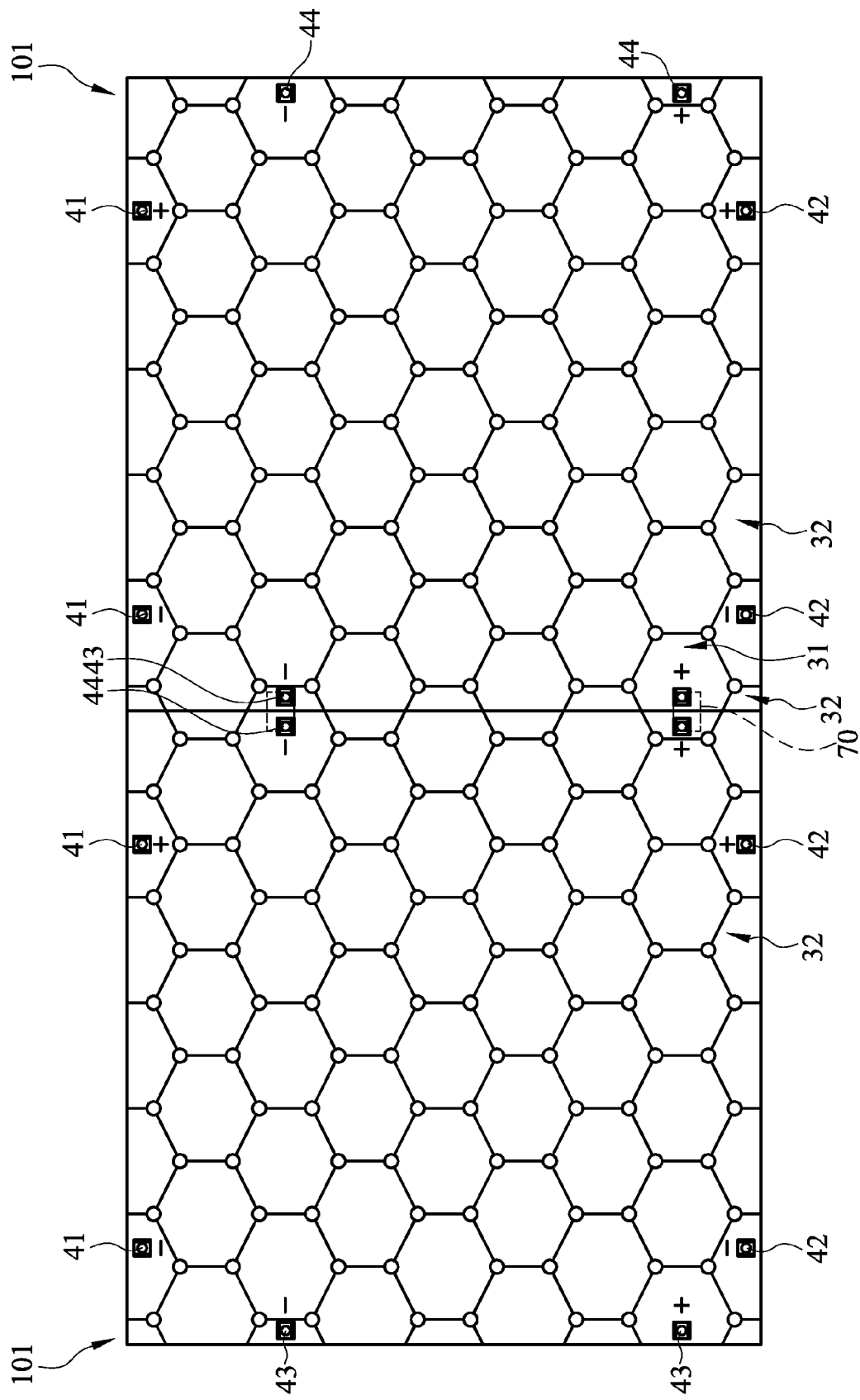
FIG. 10B shows the assembled modular structures from FIG. 10A.

As shown in FIG. 10B, when two said modular structures 101 are assembled abreast, the presence of the third power connection ports 43 and the fourth power connection ports 44 and the use of couplers 70 enable electrical connection between the modular structures 101. At this time, the 19/24-regular hexagons 33 and the 5/24-regular hexagons 34 located respectively at the third edge 23 and the fourth edge 24 jointly form a plurality of regular hexagons 31 while a ½-regular hexagon 32 is formed at each end of a boundary between the third edge 23 and the fourth edge 24.

With the foolproof design, it can be ensured that, upon assembling the modular structures 101, regular hexagons 31 are formed at the boundary between adjacent edges, and the correspondingly connected third and fourth power connection ports 43 and 44 are of the same electrode polarity so as to prevent misconnection of electrodes.

Figure 10C:
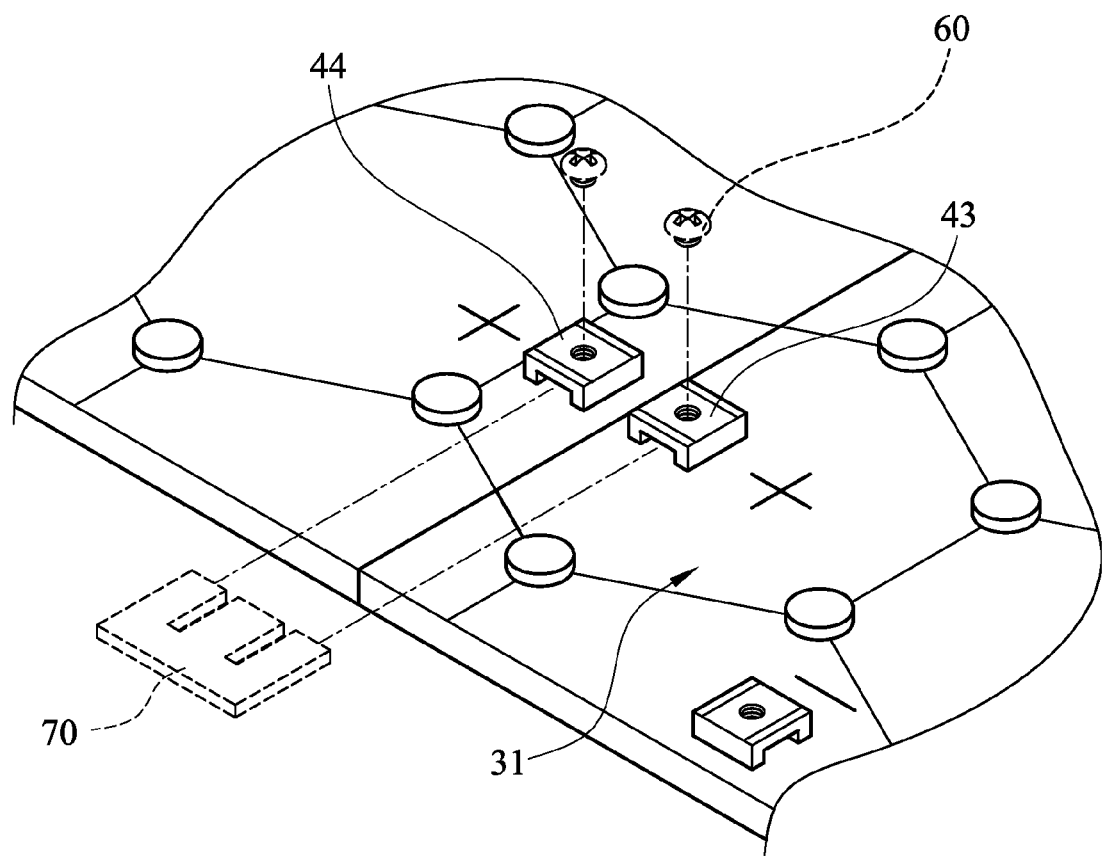
FIG. 10C is a partially enlarged perspective view of the assembled modular structures of FIG. 10B.
Figure 10D:
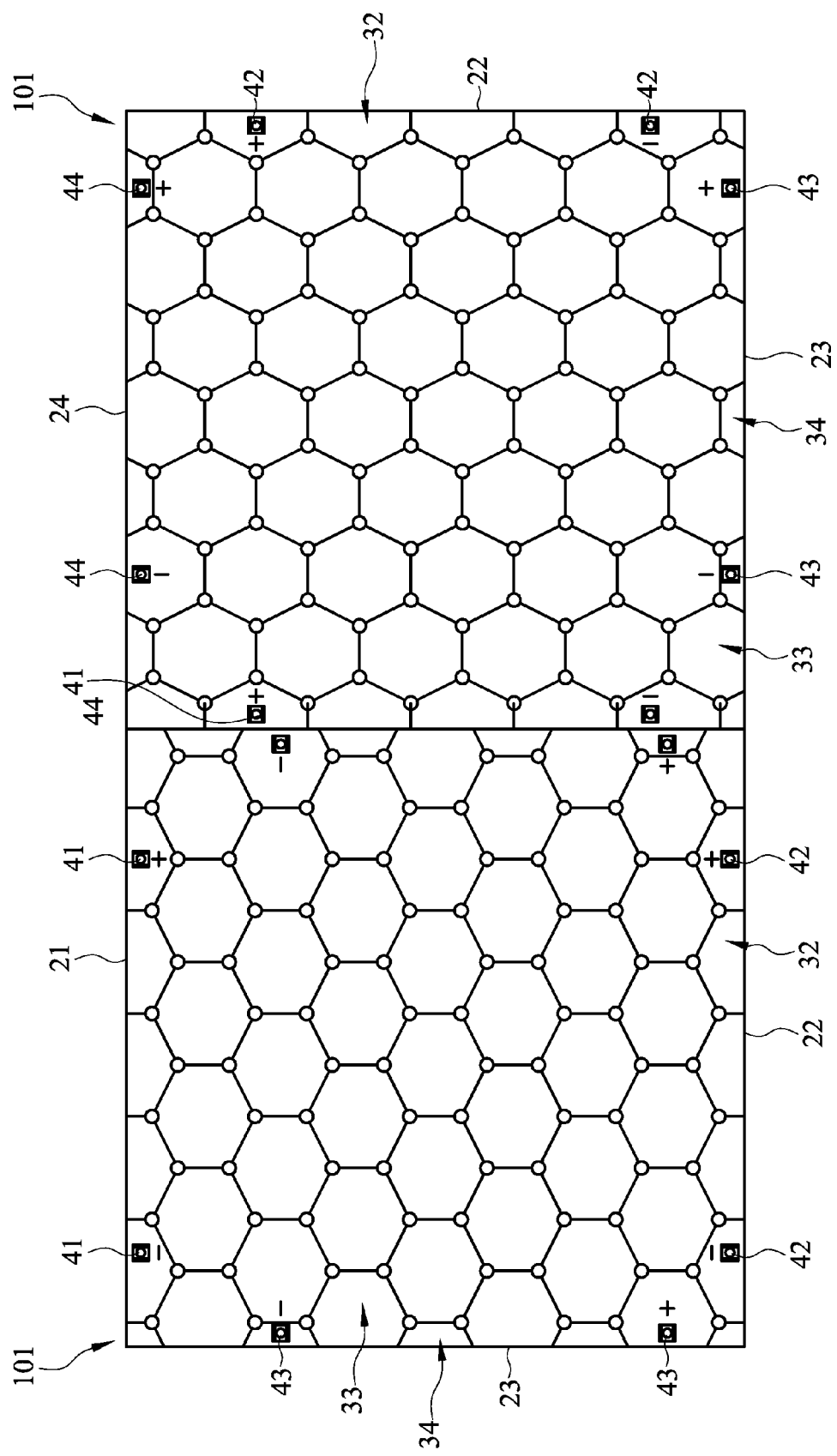
FIG. 10D shows the modular structures of the present invention arranged improperly, thereby manifesting a foolproof design of the modular structure.
Figure 11:
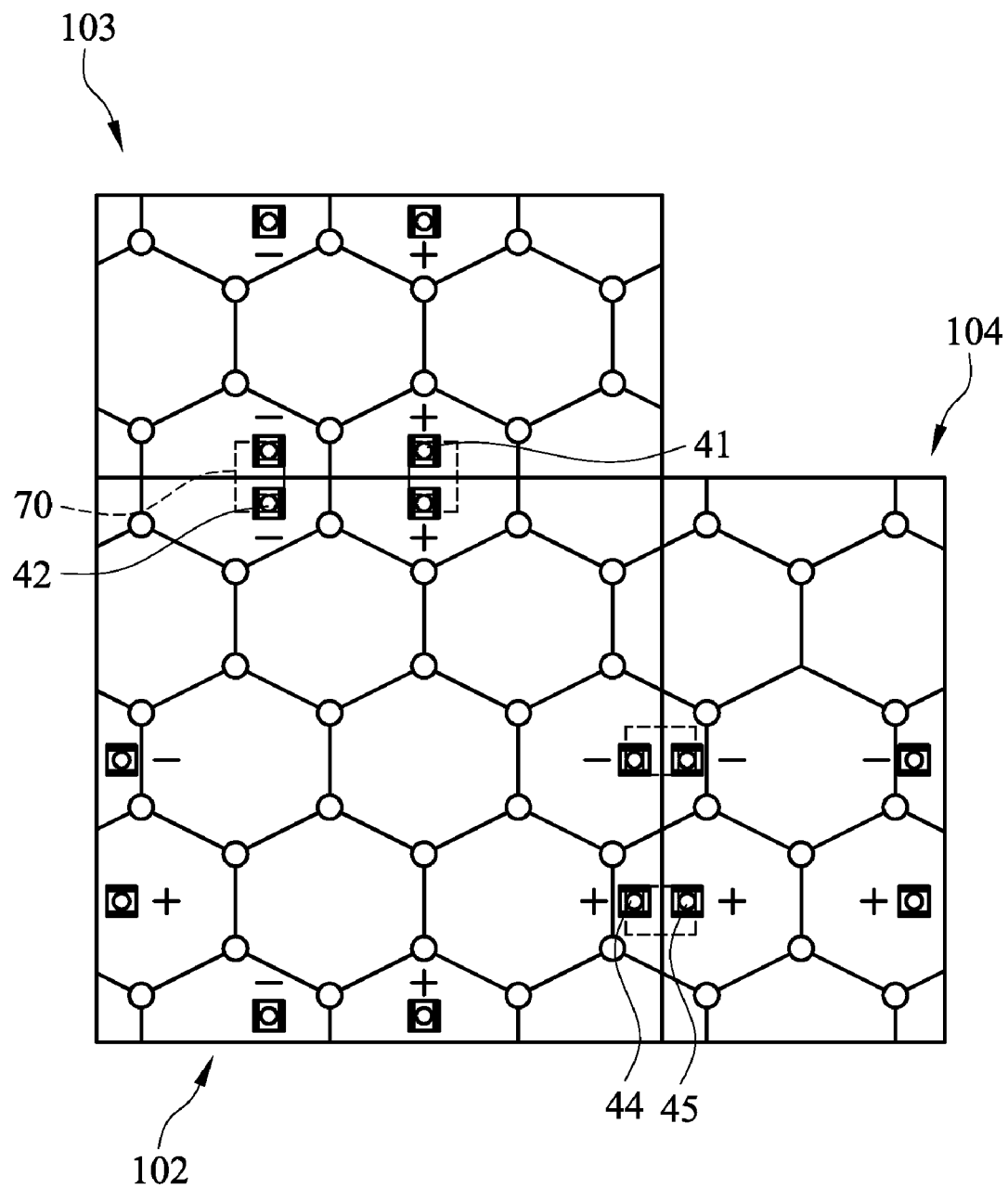
FIGS. 11 through 25 show exemplificative LED light sources composed of the modular structures of the present invention.
Figure 12:
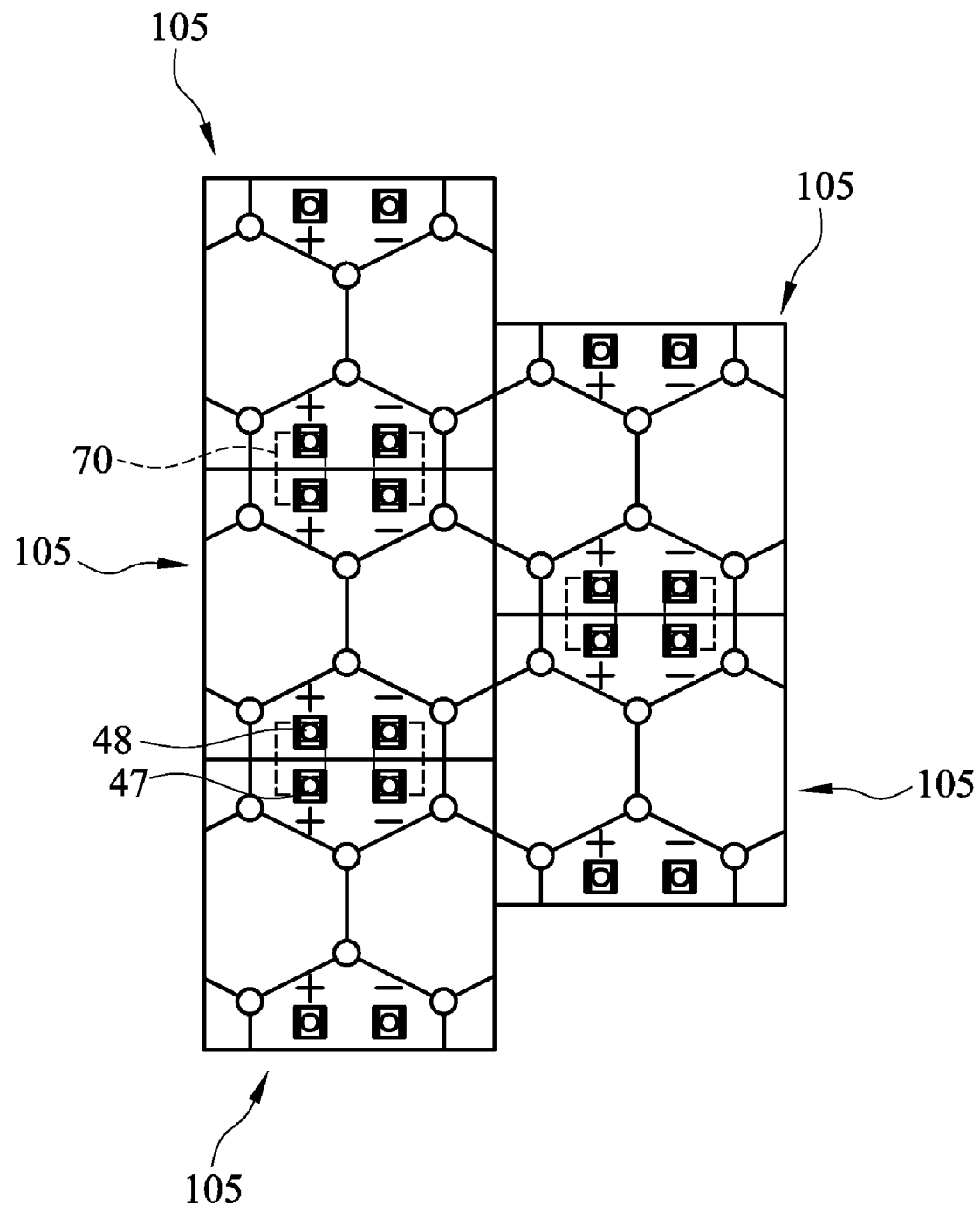
Figure 13:
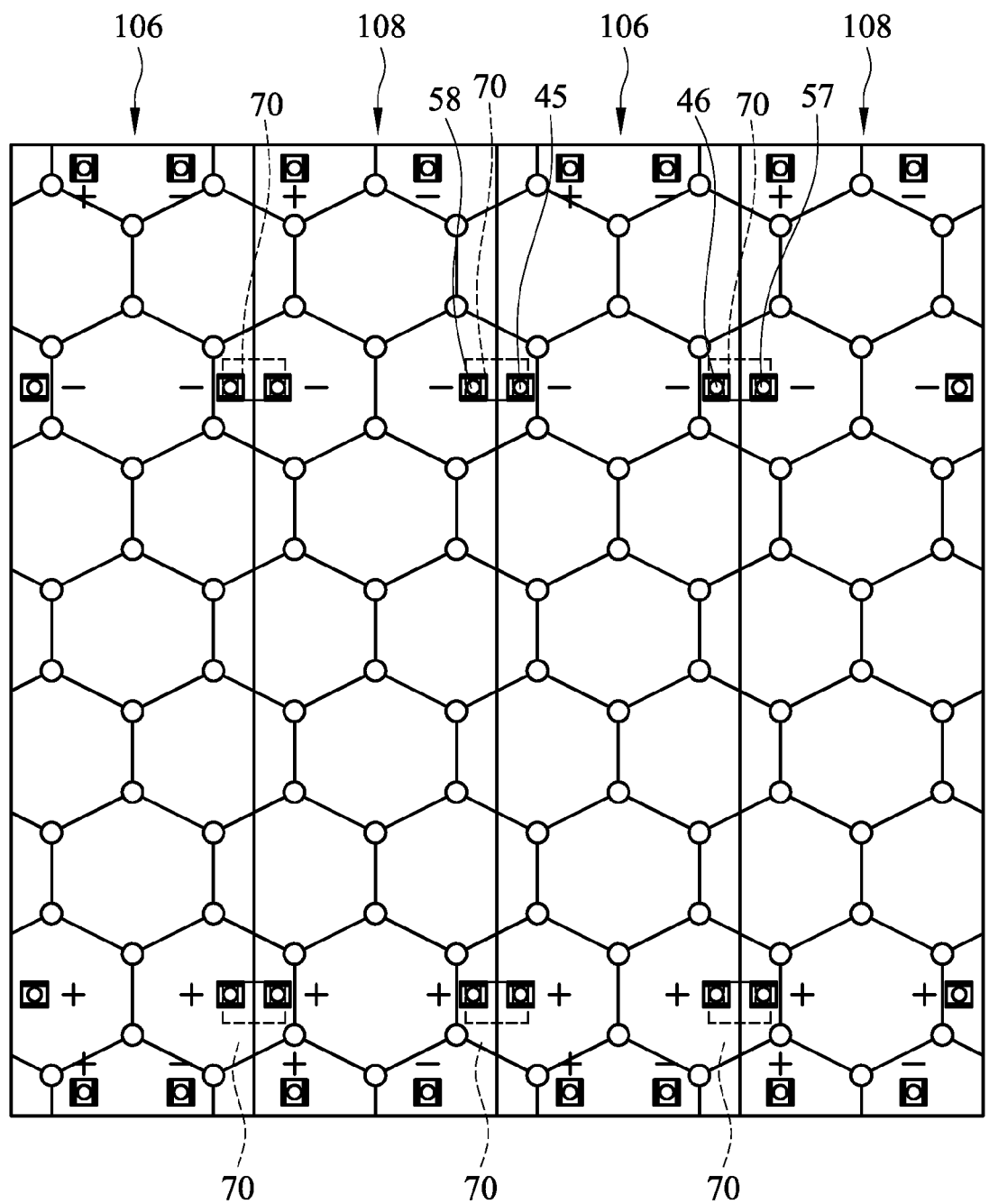
Figure 14:
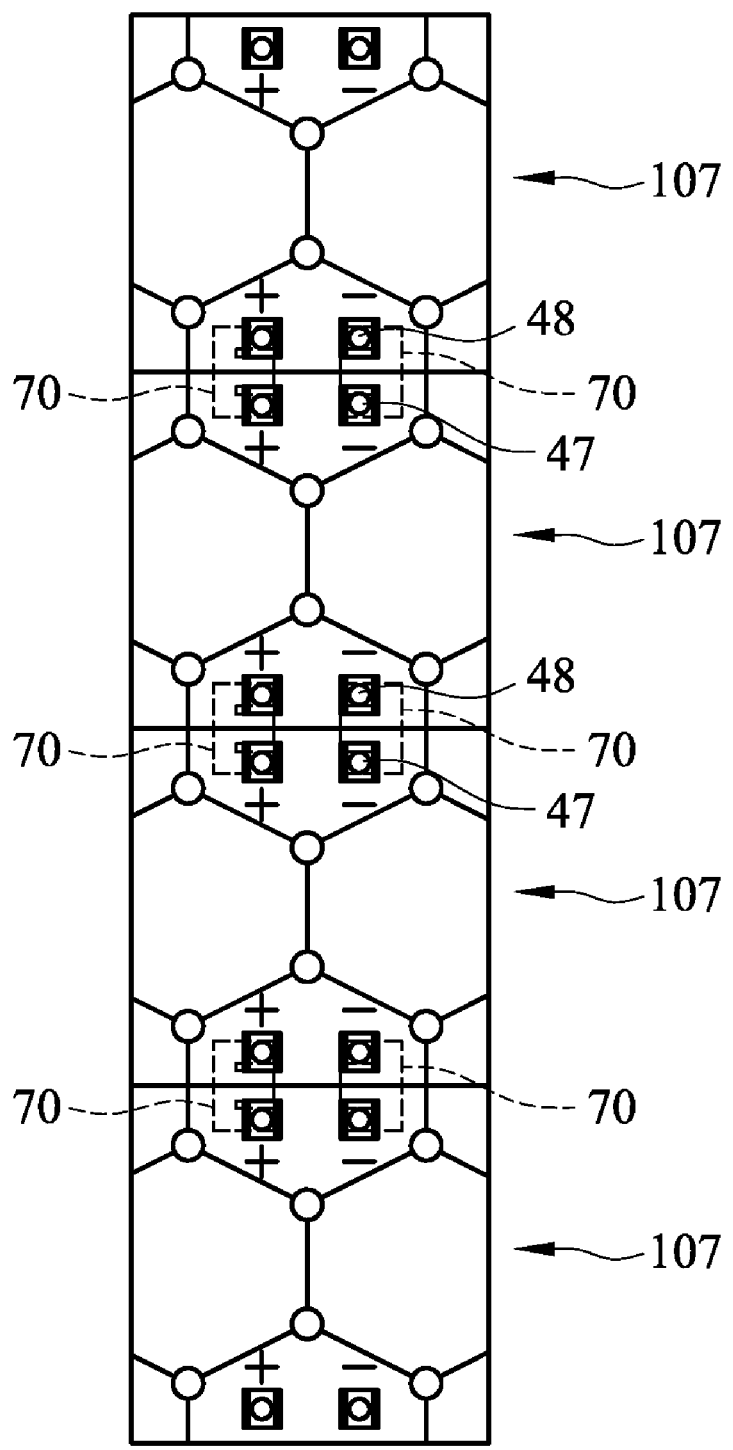
Figure 15:
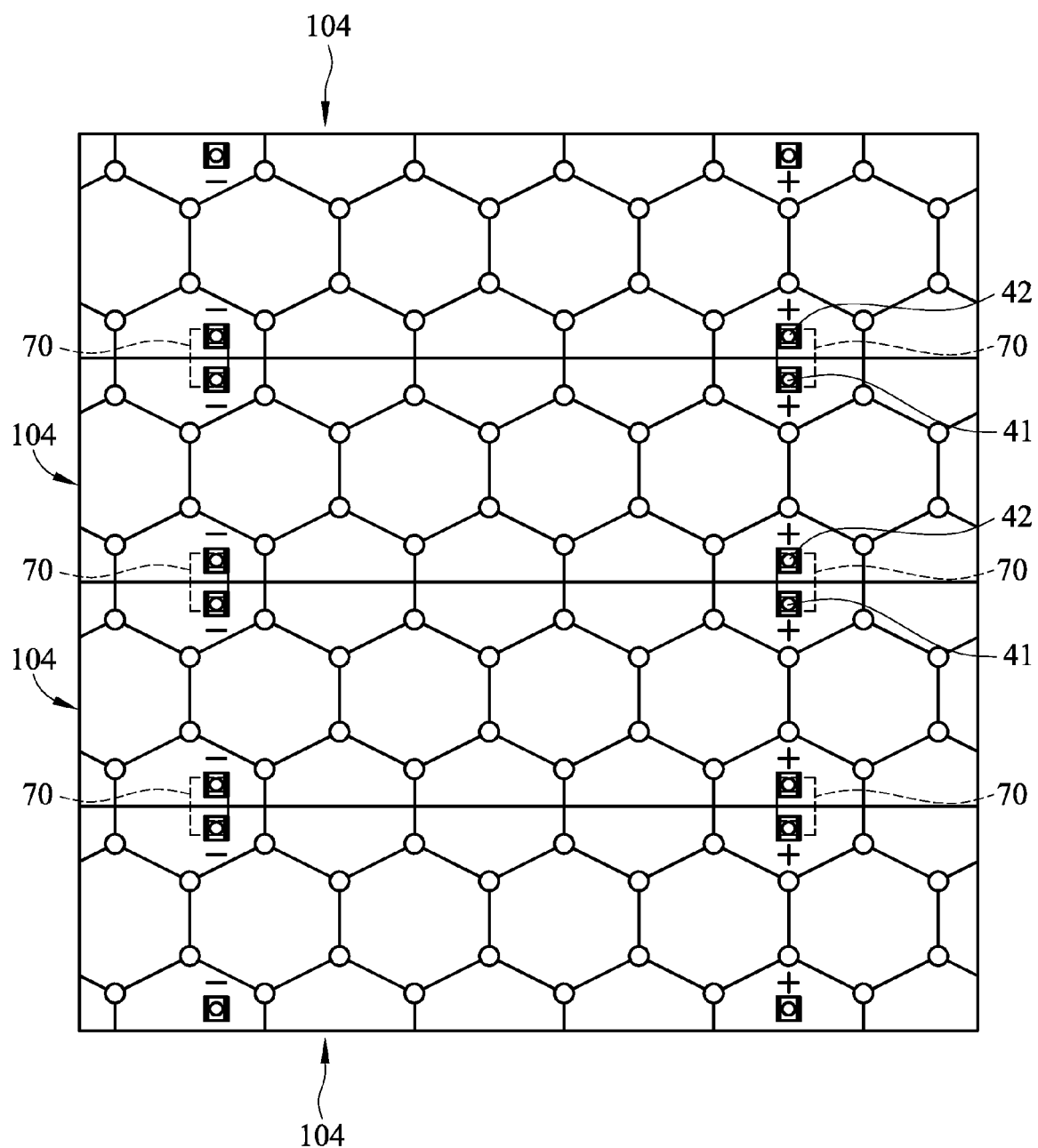
Figure 16:
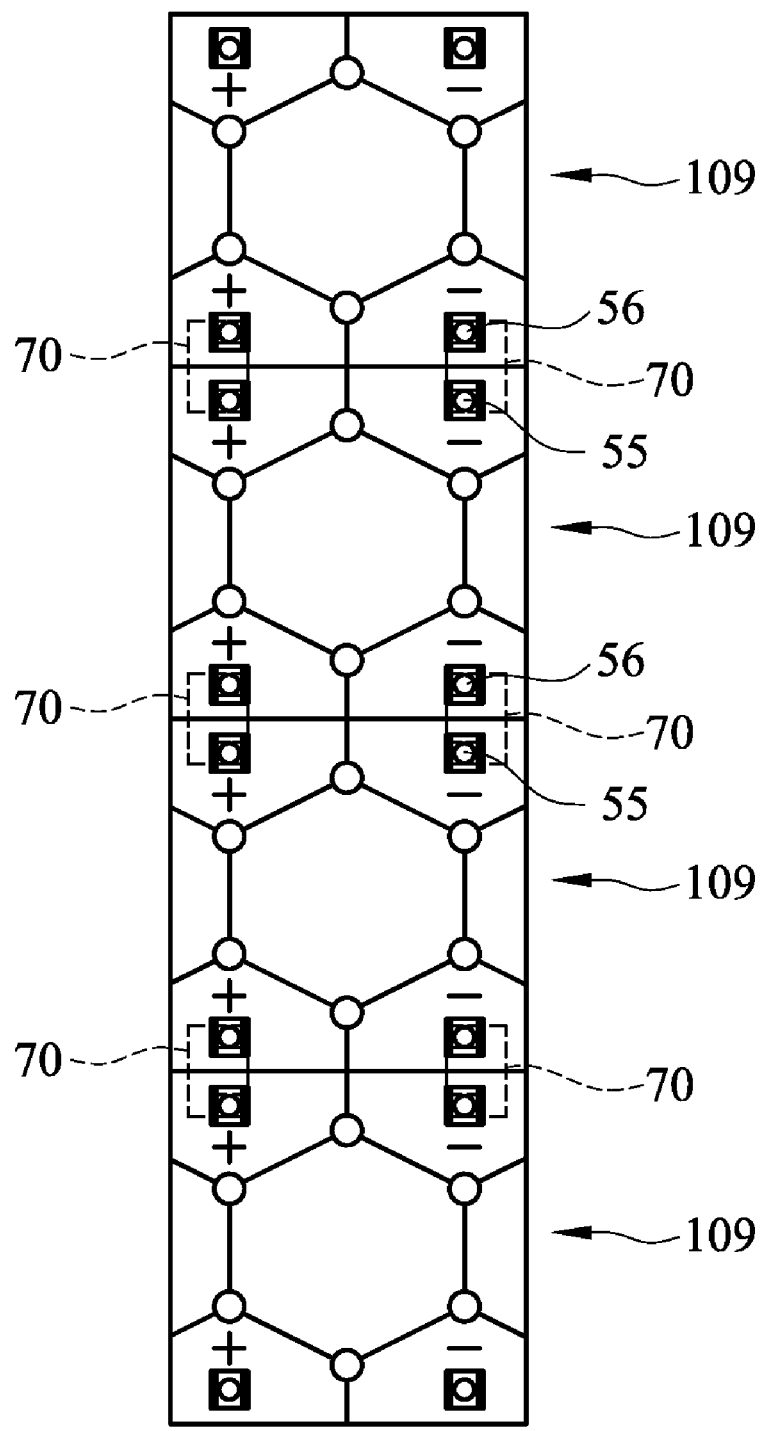
Figure 17:
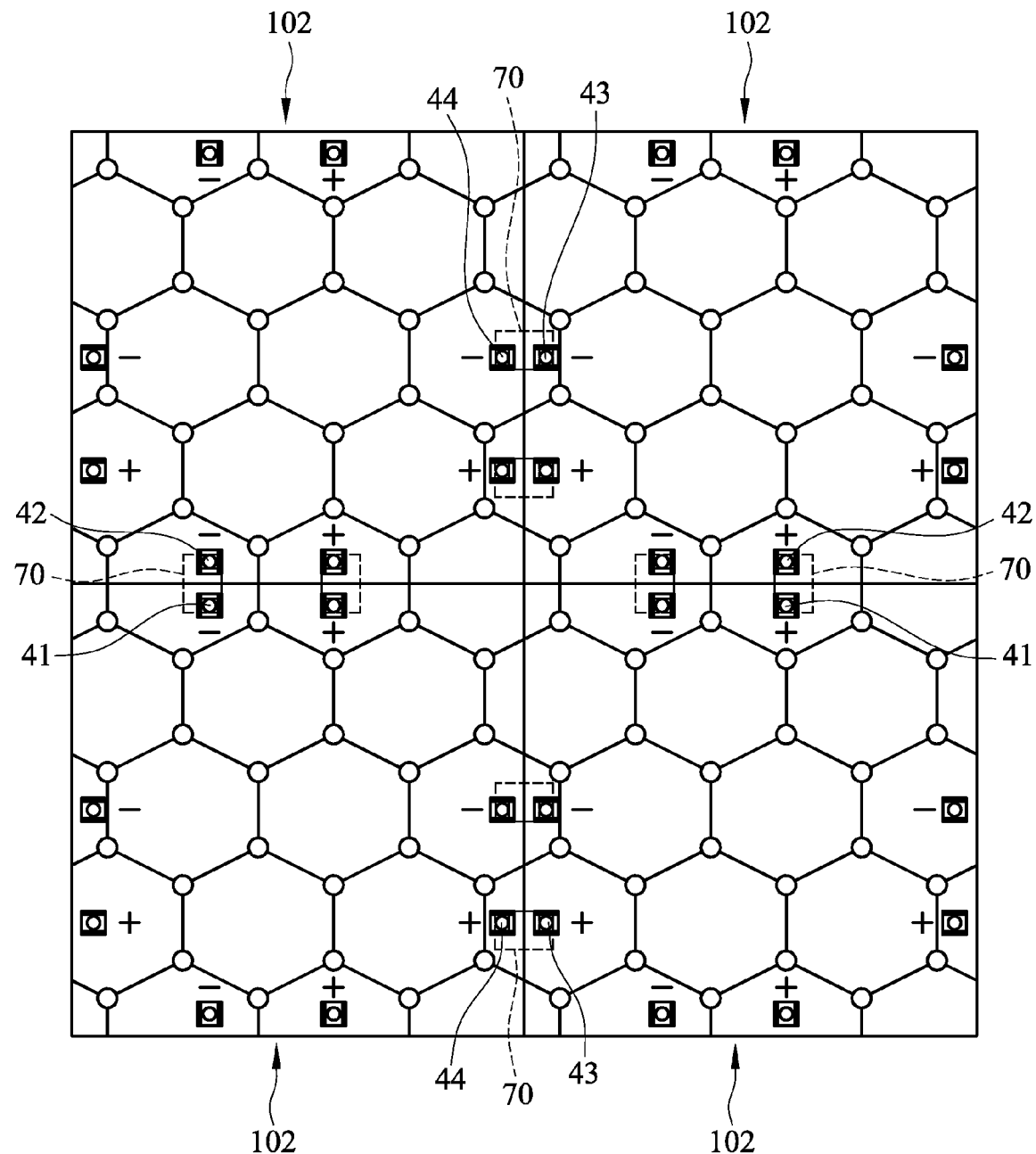
Figure 18:
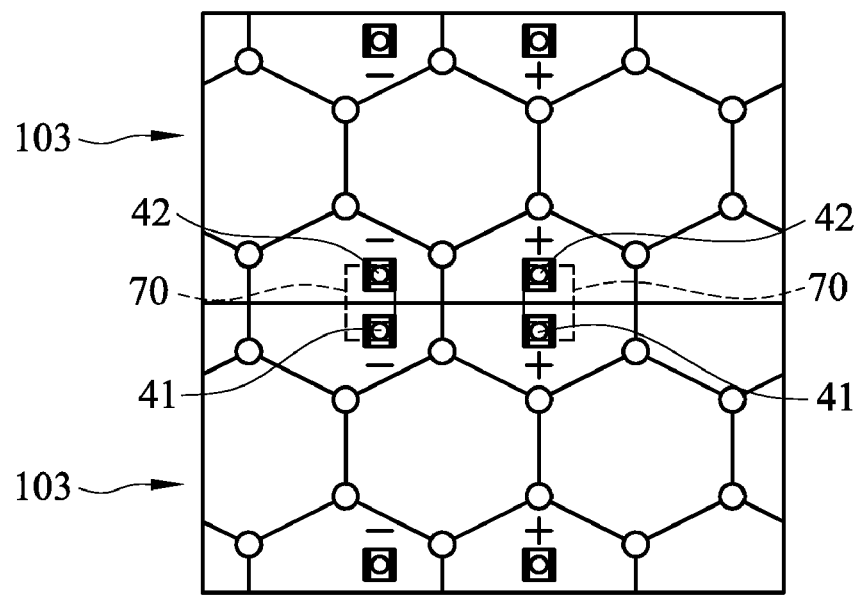
Figure 19:
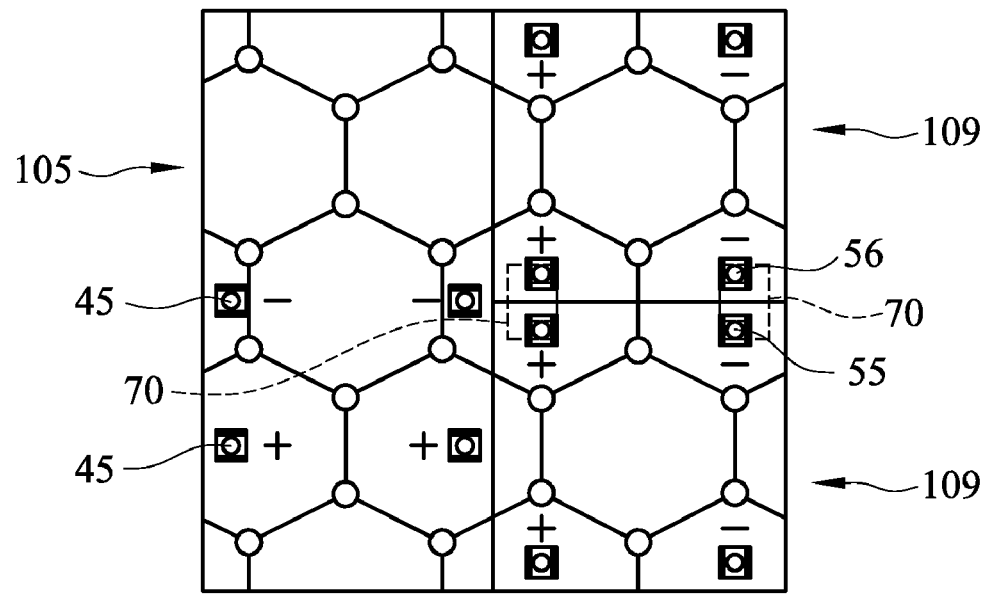
Figure 20:
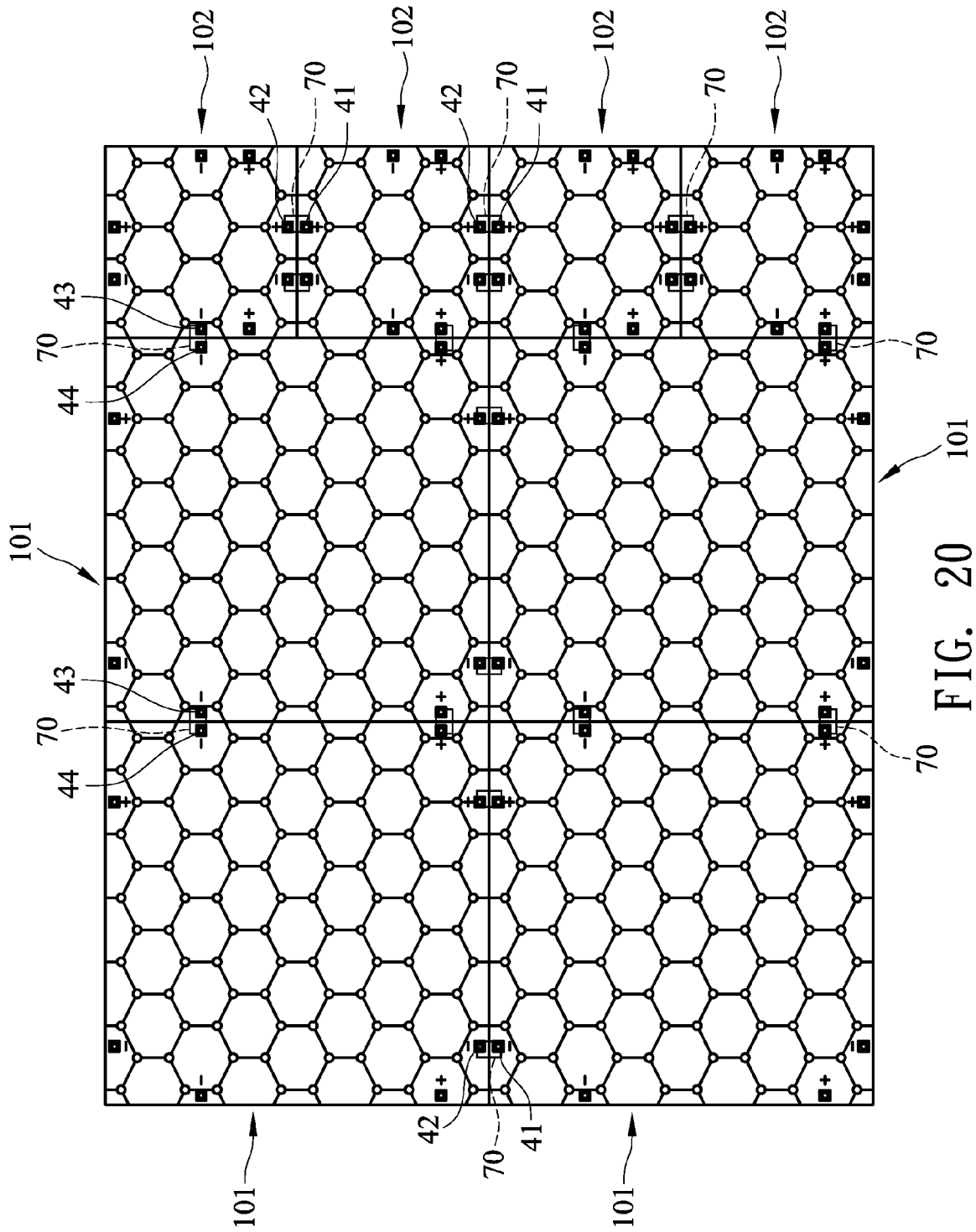
Figure 21:
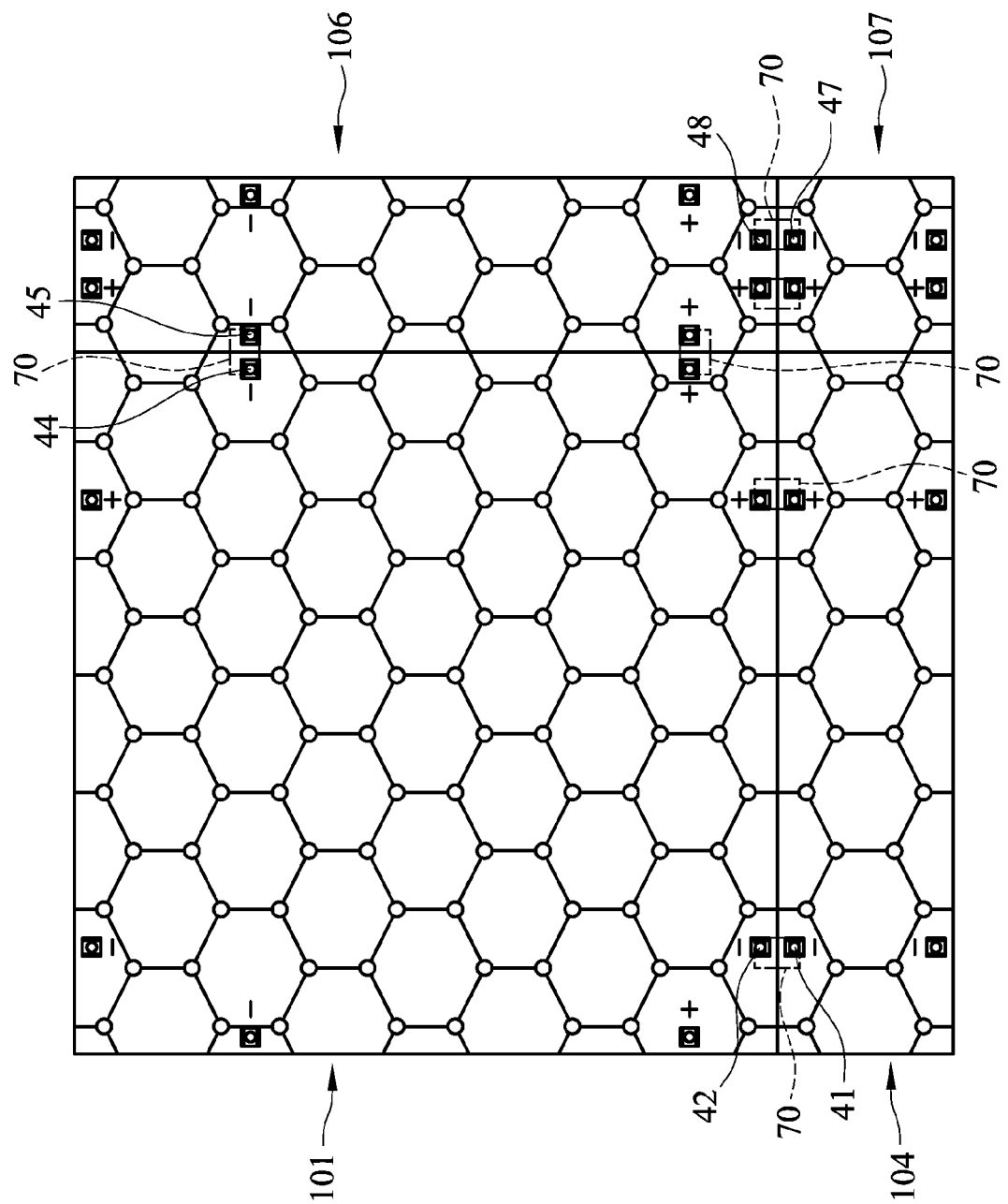
Figure 22:
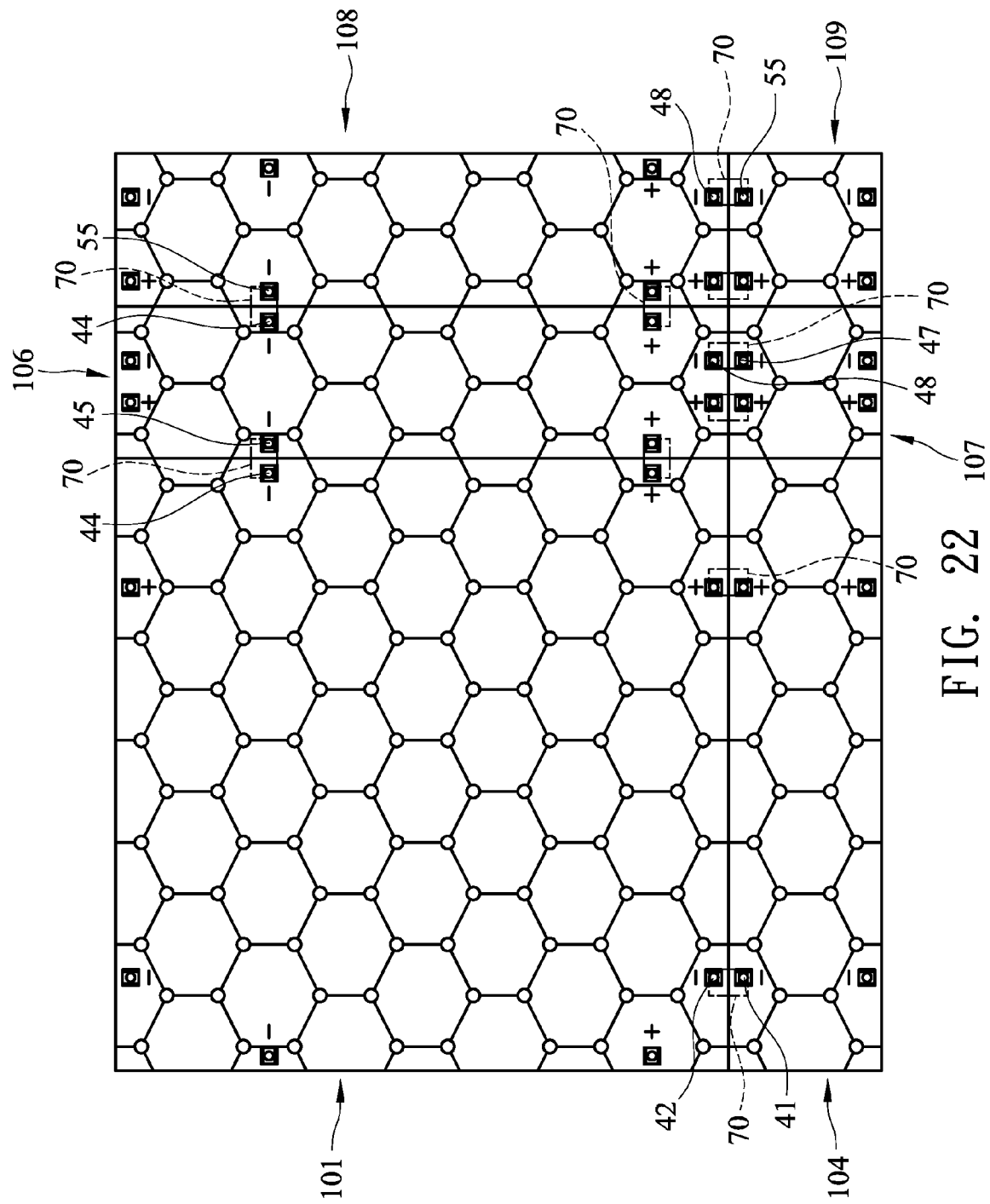
Figure 23:
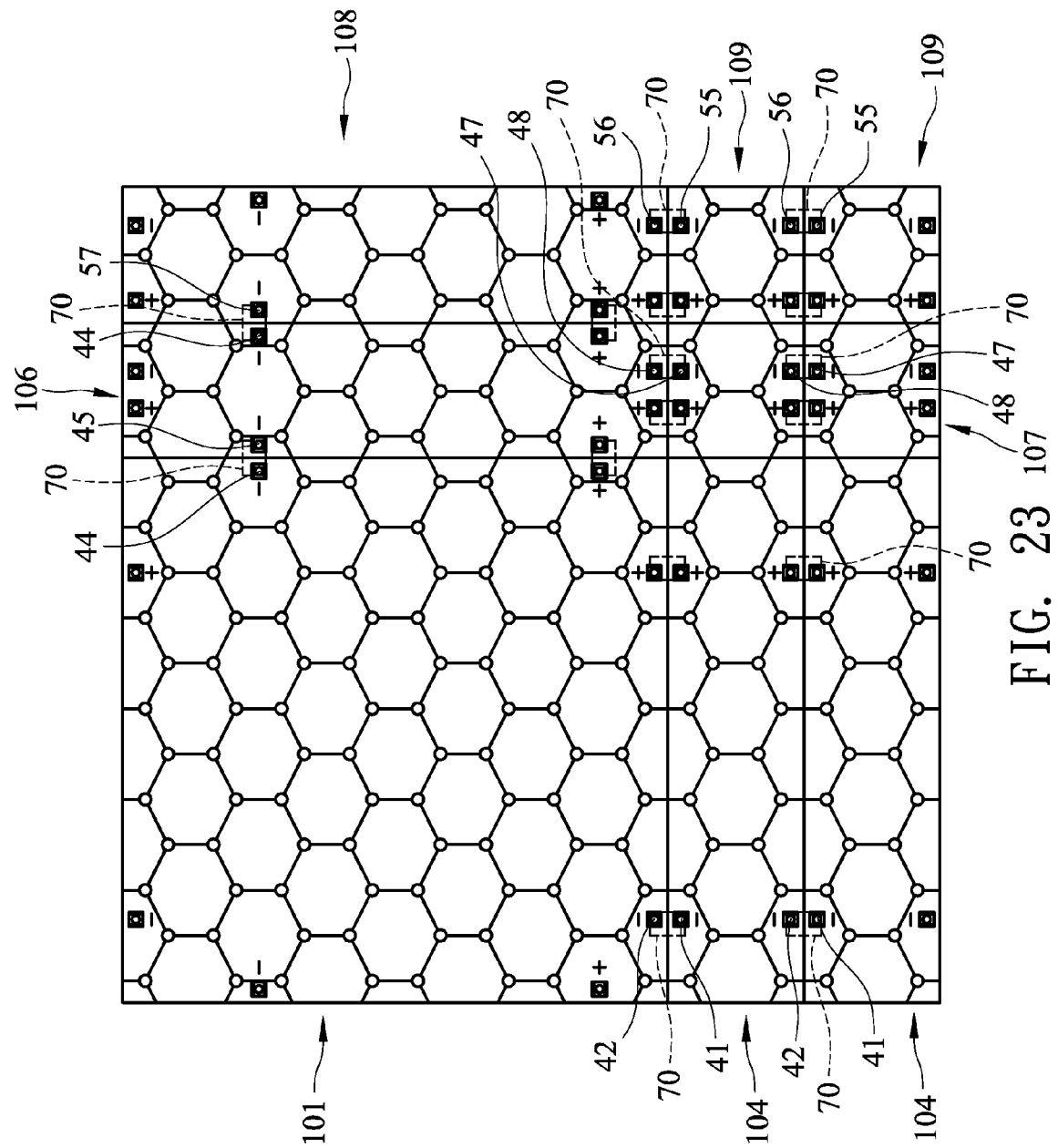
Figure 24:
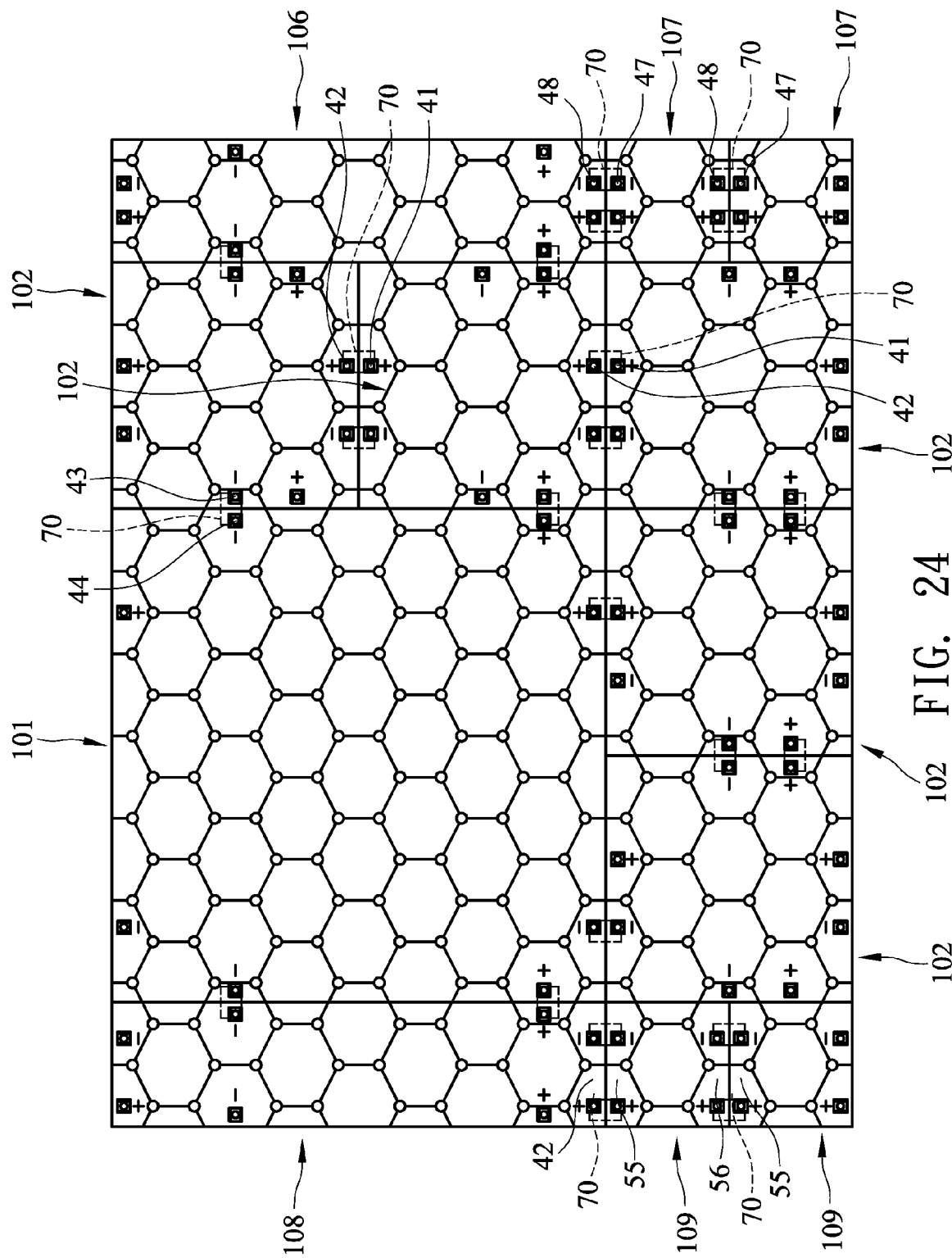
Figure 25:
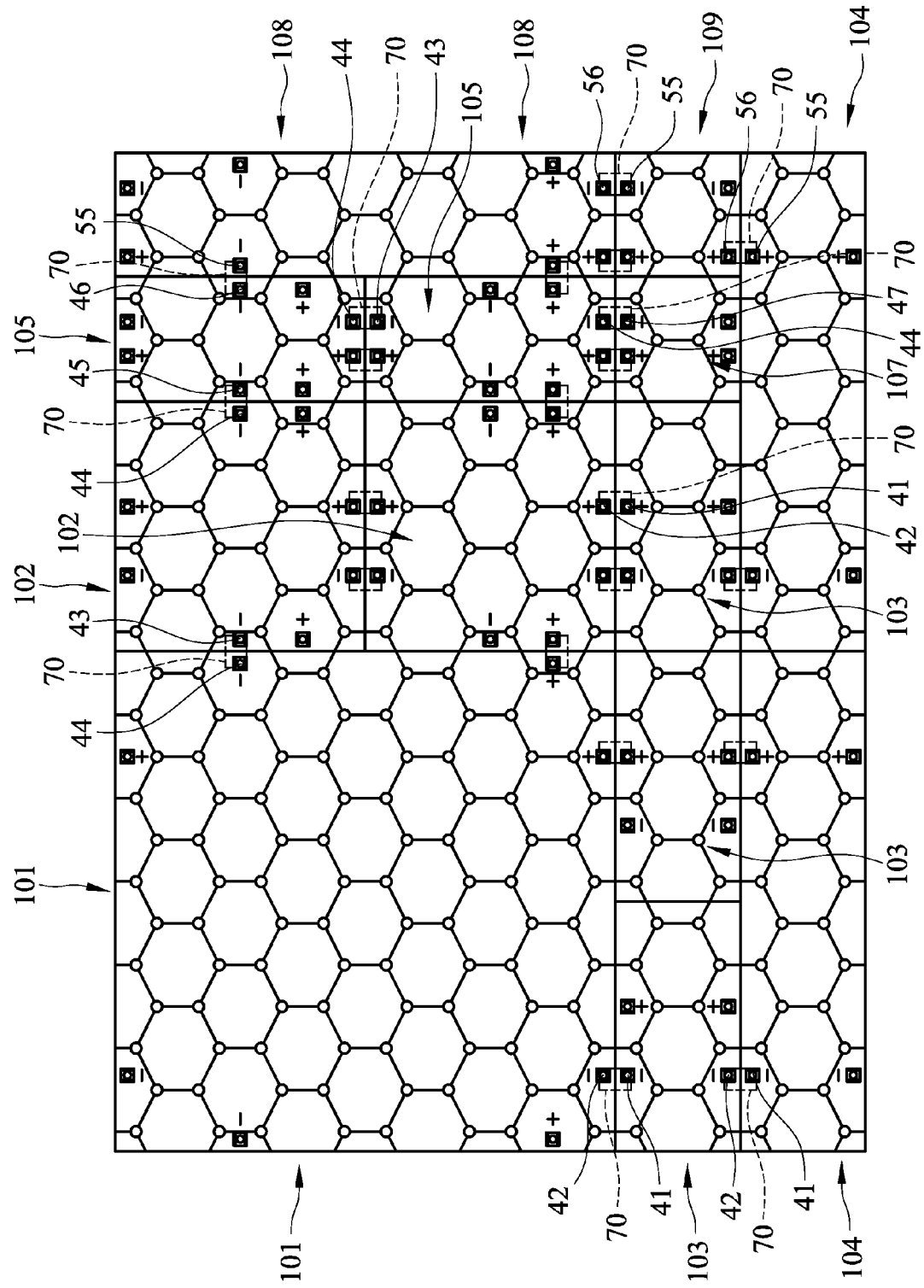

As shown in FIG. 10C, screws 60 and the coupler 70 with a fixed size are used to connect the adjacent third and fourth power connection ports 43 and 44 and thereby fasten the two adjoining modular structures 101 together. Meanwhile, the coupler 70 made of metal enables electrical connection between the modular structures 101. If the modular structures 101 are wrongly arranged, as shown in FIG 10D, it can be easily found that regular hexagons 31 are not formed at the boundary between aligned edges while the corresponding fourth and first power connection ports 44 and 41 are offset with respect to each other and have opposite polarities. As a result, the couplers 70 with the fixed size cannot fasten the corresponding power connection ports together. Thus, another foolproof design is provided to prevent misconnection between the modular structures 101.

In each said modular structure 101, 102, 103, 104, 105, 106, 107, 108, or 109, the LEDs 30 are arranged as regular hexagons 31, with an equal distance between every two adjacent LEDs 30, so that each said modular structure of the LED light source provides uniform illumination. Since commercially available AC to DC power supplies are mostly of 12V or 24V, the configuration of the present invention where each six LEDs 30 are set as one unit is favorable for circuit design.

Each said modular structure 101, 102, 103, 104, 105, 106, 107, 108, or 109 can be made into various sizes. For example, assuming that each of the edges 21, 22, 23, and 24 of the circuit board 20 of FIG. 1 has a length of A, then each of the edges 21, 22, 23, and 24 of the circuit board 20 of FIG. 2 has a length equal to ½ A; the edges 21, 22, 23, 24, 25, 26, 27, 28, 51, 52, 53, and 54 of the circuit boards 20, 20', and 20'' shown in FIGS. 3 through 6 and FIG. 8 have lengths equal to A, ½ A, or ¼ A; and each of the edges 25, 26, 27, 28, 51, 52, 53, and 54 of the circuit boards 20' and 20'' shown in FIGS. 7 and 9 has a length equal to ¼ A, wherein A may be 30 cm, 1 ft, 1 chhioh (a Taiwanese unit of linear measurement, equal to approximately 0.303 m), or any feasible length.

As shown in FIGS. 11 to 25, since the modular structures 101, 102, 103, 104, 105, 106, 107, 108, and 109 of an LED light source are of various dimensions and can be assembled into various sizes and shapes as needed by virtue of their modular nature, the application scope of the modular structures 101, 102, 103, 104, 105, 106, 107, 108, and 109 of an LED light source is significantly expanded. With the present invention, it is possible to make an LED light source of a special size by assembling the disclosed modular structures instead of manufacturing the desired LED light source in one-piece, thereby reducing manufacturing costs and potential inventory pressure.

The embodiments described above are intended to demonstrate the features of the present invention, so that a person skilled in the art is enabled to understand and carry out the contents disclosed herein. These embodiments, however, are not intended to limit the scope of the present invention. Therefore, all equivalent changes or modifications which do not depart from the spirit of the present invention should be encompassed by the appended claims.

What is claimed is:

1. A modular structure of a light-emitting diode (LED) light source, comprising:
   a circuit board, having a quadrilateral shape defined by a first edge, a second edge, a third edge, and a fourth edge, wherein the first edge and the second edge are positioned opposite each other while the third edge and the fourth edge are positioned opposite each other; and
   a plurality of LEDs, deposited on and electrically connected to the circuit board, and forming a plurality of adjoining regular hexagons, the first edge and the second edge each being composed of a plurality of ½-regular hexagons, the third edge being composed of at least an (n-m)/n-regular hexagon, the fourth edge being composed of at least an m/n-regular hexagon, wherein n and m are natural numbers, n>m, and n≠2.

2. The modular structure of the LED light source of claim 1, wherein the circuit board is a square circuit board.

3. The modular structure of the LED light source of claim 1, wherein the circuit board is a rectangular circuit board.

4. The modular structure of the LED light source of claim 1, wherein the circuit board further comprises a set of first power connection ports and a set of second power connection ports, in which the first power connection ports and the second power connection ports are settled near the first edge and the second edge, respectively, and are mirror images of each other across a line extending between midpoints of the third edge and the fourth edge.

5. The modular structure of the LED light source of claim 4, wherein the circuit board further comprises a set of third power connection ports and a set of fourth power connection ports, in which the third power connection ports and the fourth power connection ports are settled near the third edge and the fourth edge, respectively, and are mirror images of each other across a line extending between midpoints of the first edge and the second edge.

6. The modular structure of the LED light source of claim 1, wherein the third edge is composed of at least one said (n-m)/n-regular hexagon arranged alternately with at least one said m/n-regular hexagon.

7. The modular structure of the LED light source of claim 6, wherein the fourth edge is composed of at least one said (n-m)/n-regular hexagon arranged alternately with at least one said m/n-regular hexagon.

8. A modular structure of a light-emitting diode (LED) light source, comprising:
   a circuit board, having a quadrilateral shape defined by a fifth edge, a sixth edge, a seventh edge, and an eighth edge, wherein the fifth edge and the sixth edge are positioned opposite each other while the seventh edge and the eighth edge are positioned opposite each other; and
   a plurality of LEDs, deposited on and electrically connected to the circuit board, and forming a plurality of adjoining regular hexagons, the fifth edge and the sixth edge each being composed of at least a ½-regular hexagon, the seventh edge and the eighth edge each being composed of at least an (n-m)/n-regular hexagon, wherein n and m are natural numbers, n>m, and n≠2.

9. The modular structure of the LED light source of claim 8, wherein the circuit board is a rectangular circuit board.

10. The modular structure of the LED light source of claim 8, wherein the circuit board is a square circuit board.

11. The modular structure of the LED light source of claim 8, wherein the circuit board further comprises a set of seventh power connection ports and a set of eighth power connection ports, in which the seventh power connection ports and the eighth power connection ports are settled near the fifth edge and the sixth edge, respectively, and are mirror images of each other across a line extending between midpoints of the seventh edge and the eighth edge.

12. The modular structure of the LED light source of claim 11, wherein the circuit board further comprises a set of fifth power connection ports and a set of sixth power connection ports, in which the fifth power connection ports and the sixth power connection ports are settled near the seventh edge and the eighth edge, respectively, and are mirror images of each other across a line extending between midpoints of the fifth edge and the sixth edge.

13. The modular structure of the LED light source of claim 8, wherein the seventh edge and the eighth edge are each composed of at least one said (n-m)/n-regular hexagon arranged alternately with at least an m/n-regular hexagon.

14. A modular structure of a light-emitting diode (LED) light source, comprising:
   a circuit board, having a quadrilateral shape defined by a ninth edge, a tenth edge, an eleventh edge, and a twelfth edge, wherein the ninth edge and the tenth edge are positioned opposite each other while the eleventh edge and the twelfth edge are positioned opposite each other; and
   a plurality of LEDs, deposited on and electrically connected to the circuit board, and forming a plurality of adjoining regular hexagons, the ninth edge and the tenth edge each being composed of an (n-m)/2n-regular hexagon, the eleventh edge and the twelfth edge each being composed of at least an m/n-regular hexagon, wherein n and m are natural numbers, n>m, and n≠2.

15. The modular structure of the LED light source of claim 14, wherein the circuit board is a rectangular circuit board.

16. The modular structure of the LED light source of claim 14, wherein the circuit board is a square circuit board.

17. The modular structure of the LED light source of claim 14, wherein the circuit board further comprises a set of ninth power connection ports and a set of tenth power connection ports, in which the ninth power connection ports and the tenth power connection ports are settled near the ninth edge and the tenth edge, respectively, and are mirror images of each other across a line extending between midpoints of the eleventh edge and the twelfth edge.

18. The modular structure of the LED light source of claim 17, wherein the circuit board further comprises a set of eleventh power connection ports and a set of twelfth power connection ports, wherein the eleventh power connection ports and the twelfth power connection ports are settled near the eleventh edge and the twelfth edge, respectively, and are mirror images of each other across a line extending between midpoints of the ninth edge and the tenth edge.

19. The modular structure of the LED light source of claim 14, wherein the eleventh edge and the twelfth edge are each composed of at least an (n-m)/n-regular hexagon arranged alternately with at least one said m/n-regular hexagon.

\* \* \* \* \*